(12) United States Patent
Yatsuda et al.

(10) Patent No.: US 7,484,872 B2
(45) Date of Patent: *Feb. 3, 2009

(54) VEHICLE LAMP

(75) Inventors: Yasushi Yatsuda, Tokyo (JP); Teruo Koike, Tokyo (JP); Takuya Kushimoto, Tokyo (JP); Takashi Futami, Tokyo (JP); Ryotaro Owada, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/764,801

(22) Filed: Jun. 18, 2007

(65) Prior Publication Data

US 2007/0263404 A1  Nov. 15, 2007

(51) Int. Cl.
*F21V 21/00* (2006.01)
*F21V 13/04* (2006.01)
*F21V 7/00* (2006.01)

(52) U.S. Cl. .................. 362/545; 362/242; 362/538; 362/539

(58) Field of Classification Search .................. 362/511, 362/538, 545, 242, 539
See application file for complete search history.

(56) References Cited

U.S. PATENT DOCUMENTS

| | | | |
|---|---|---|---|
| 3,876,900 A | 4/1975 | Amatsuka et al. | |
| 5,113,321 A * | 5/1992 | Suzuki | 362/538 |
| 6,038,387 A | 3/2000 | Machida | |
| 6,066,861 A | 5/2000 | Hohn et al. | |
| 6,245,259 B1 | 6/2001 | Hohn et al. | |
| 6,277,301 B1 | 8/2001 | Hohn et al. | |
| 6,441,943 B1 | 8/2002 | Roberts et al. | |
| 6,565,247 B2 | 5/2003 | Thominet | |
| 6,576,930 B2 | 6/2003 | Reeh et al. | |
| 6,592,780 B2 | 7/2003 | Hohn et al. | |
| 6,613,247 B1 | 9/2003 | Hohn et al. | |
| 6,639,360 B2 | 10/2003 | Roberts et al. | |
| 6,669,866 B1 | 12/2003 | Kummer et al. | |
| 6,774,401 B2 | 8/2004 | Nakada et al. | |
| 6,809,342 B2 | 10/2004 | Harada | |
| 6,812,500 B2 | 11/2004 | Reeh et al. | |

(Continued)

FOREIGN PATENT DOCUMENTS

DE      20206833 U      7/2002

(Continued)

OTHER PUBLICATIONS

Search Report for EP App. No. 03021470.4 (Jan. 18, 2006).

(Continued)

*Primary Examiner*—Sandra O'Shea
*Assistant Examiner*—James W Cranson
(74) *Attorney, Agent, or Firm*—Cermak Kenealy Vaidya & Nakajima LLP

(57) ABSTRACT

A vehicle lamp can include a plurality of light source modules each having an LED as a light source, and optical systems for distributing light from each of the light source modules frontward toward predetermined areas or predetermined patterns that are different from each other and which make up a light distribution pattern. Each of the optical systems can be optimized to emit light to a predetermined area, and each of the light source modules' LEDs can be optimally arranged for each of the corresponding optical systems.

20 Claims, 28 Drawing Sheets

U.S. PATENT DOCUMENTS

| | | | |
|---|---|---|---|
| 6,827,473 | B2 | 12/2004 | Kobayashi |
| 6,850,001 | B2 | 2/2005 | Takekuma |
| 6,855,958 | B2 | 2/2005 | Sato et al. |
| 6,882,110 | B2 | 4/2005 | Ishida et al. |
| 6,891,333 | B2 | 5/2005 | Tatsukawa et al. |
| 6,948,836 | B2 | 9/2005 | Ishida et al. |
| 6,951,416 | B2 | 10/2005 | Sazuka et al. |
| 6,997,587 | B2 | 2/2006 | Albou |
| 7,232,247 | B2 * | 6/2007 | Yatsuda et al. .............. 362/545 |
| 2001/0019486 | A1 | 9/2001 | Thominet |
| 2002/0185966 | A1 | 12/2002 | Murano |
| 2002/0191395 | A1 | 12/2002 | Fleury |
| 2003/0198060 | A1 | 10/2003 | Ishida et al. |
| 2003/0230757 | A1 | 12/2003 | Suehiro et al. |
| 2004/0008516 | A1 | 1/2004 | Amano |
| 2004/0018446 | A1 | 1/2004 | Aoki et al. |
| 2004/0090790 | A1 | 5/2004 | Ishida et al. |
| 2004/0130907 | A1 | 7/2004 | Albou |
| 2004/0136197 | A1 | 7/2004 | Ishida |
| 2004/0136202 | A1 | 7/2004 | Ishida et al. |
| 2004/0160772 | A1 | 8/2004 | Tatsukawa et al. |
| 2004/0160783 | A1 | 8/2004 | Tatsukawa et al. |
| 2004/0196663 | A1 | 10/2004 | Ishida et al. |
| 2004/0208020 | A1 | 10/2004 | Ishida |
| 2004/0223338 | A1 | 11/2004 | Koike et al. |
| 2004/0251469 | A1 | 12/2004 | Yatsuda et al. |
| 2004/0257827 | A1 | 12/2004 | Ishida et al. |
| 2005/0018446 | A1 | 1/2005 | Ishida |
| 2005/0041434 | A1 | 2/2005 | Yatsuda et al. |
| 2005/0041436 | A1 | 2/2005 | Ishida |
| 2005/0052878 | A1 | 3/2005 | Yamada et al. |

FOREIGN PATENT DOCUMENTS

| | | |
|---|---|---|
| DE | 10205779 | 10/2003 |
| EP | 1081771 | 3/2001 |
| EP | 1447616 | 8/2004 |
| EP | 1447617 | 8/2004 |
| GB | 2400166 | 10/2004 |
| GB | 2402203 | 12/2004 |
| JP | 59124179 | 7/1984 |
| JP | 01120702 | 5/1989 |
| JP | 05226691 | 9/1993 |
| JP | 06202242 | 7/1994 |
| JP | 10190065 | 7/1998 |
| JP | 10256607 | 9/1998 |
| JP | 11087782 | 3/1999 |
| JP | 2000150968 | 5/2000 |
| JP | 2001127346 | 5/2001 |
| JP | 2001196639 | 7/2001 |
| JP | 2001210872 | 8/2001 |
| JP | 2001345483 | 12/2001 |
| JP | 2002094127 | 3/2002 |
| JP | 2002289926 | 10/2002 |
| JP | 2003031007 | 1/2003 |
| JP | 2003031011 | 1/2003 |
| JP | 2003123517 | 4/2003 |
| JP | 2003346518 | 12/2003 |
| JP | 2004056075 | 2/2004 |
| JP | 2004063499 | 2/2004 |
| WO | WO03071352 | 8/2003 |

OTHER PUBLICATIONS

Search Report for EP App. No. 04005014.8 (Oct. 6, 2006).

* cited by examiner

L

VEHICLE LAMP

This invention claims the benefit under 35 U.S.C. §119 of Japanese Patent Application No. 2003-364866, filed on Oct. 24, 2003, and under 35 U.S.C. §120 of co-pending U.S. patent application Ser. No. 10/778,601 filed on Feb. 17, 2004, and U.S. patent application Ser. No. 11/275,255 filed on Dec. 21, 2005 which are all hereby incorporated in their entireties by reference.

FIELD OF THE INVENTION

The present invention relates to a vehicle lamp, and more particularly to a vehicle headlight such as a headlight and a sub-headlight using a plurality of LED devices as the light source.

DESCRIPTION OF RELATED ART

In recent years, with the increase of power and intensity of white LEDs, white LEDs have been considered for use as the light source for a vehicle lamp. The advantages of using the LEDs are expected to be the acquisition of a non-replaceable light source, lowering of power consumption and size-reduction of the lighting fixture itself.

However, though the power of white LEDs has increased, for each individual LED light source both the luminous flux and the intensity are low compared to an individual conventional light source using an electric discharge lamp, such as a halogen lamp, an HID lamp, etc. The luminous flux of a white LED is approximately 1/20 of that of a halogen lamp and approximately 1/60 of that of an HID lamp in the present situation. Furthermore, since it may be difficult, even in the future, for the flux and the intensity of an LED to reach those equal to those of an HID lamp, it is preferable to make a vehicle lamp with an optical system that uses a plurality of LEDs in order to use an LED as a light source of a vehicle lamp.

A vehicle lamp as described above, for example a conventional vehicle lamp as shown in FIGS. 25-27, will now be described.

First, a vehicle lamp 1 shown in FIG. 25 comprises a light source module 2 in which a plurality of LEDs 2a are arranged and mounted on the surface of a substrate having a dented shape facing the front. A projector lens 3 is arranged in front of the light source module 2, and a shading member 4 is arranged in the vicinity of the focusing position F on the light source side of the projector lens 3.

Each of the LEDs 2a of the above light source module 2 is respectively arranged such that its optical axis is directed to the focusing position F of the projector lens 3 and is respectively adapted to be illuminated by being supplied with a driving current from a driving unit (not shown). The projector lens 3 comprises a convex lens and is adapted to converge and frontwardly emit the light irradiated from each of the LEDs 2a of the light source module 2. The shading member 4 has an edge 4a formed such that it forms a cut-off to create a light distribution pattern for a low beam.

According to the vehicle lamp having such a structure, each of the LEDs 2a of the light source module 2 is illuminated by being supplied with a driving current, and the light irradiated from each of the LEDs 2a respectively travels toward the focusing position F of the projector lens 3 and is converged and emitted frontward by the projector lens 3.

In this case, as shown in FIG. 26, due to the shading member 4 forming a cut-off, the above mentioned light is emitted frontward and within the area of a light distribution pattern L for a so-called low beam. Thereby, the vehicle lamp is configured such that it does not give any glaring or dazzling light to oncoming cars and pedestrians when used as a headlamp.

A vehicle lamp 5 shown in FIG. 27 comprises a light source module comprising a plurality of LEDs 6a arranged circumferentially around a central axis extending frontward. A reflector 7 reflects light from the light source module 6 towards the front. A projector lens 3 causes the reflected light from the reflector 7 to converge, and a shading member 4 forms a cut-off for dipped light-distribution.

As shown in FIG. 27 (B), each of the LEDs 6a of the light source module 6 is arranged such that its optical axis extends from the central axis in an outward radial direction. The reflector 7 comprises, for example, an ellipsoid of revolution, and each of the LEDs 6a of the light source module 6 is arranged in the vicinity of a first focusing position of the surface, and a second focusing position of the surface is in the vicinity of a focusing position on the light source side of the projector lens 3.

According to the vehicle lamp 5 having such a structure, each of the LEDs 6a of the light source module 6 is illuminated by being supplied with a driving current. The light irradiated from each of the LEDs 6a is respectively reflected by the reflector 7 and travels toward the second focus of the reflector 7, i.e., a focusing position F of the projector lens 3. Then, the light is caused to converge by the projector lens 3, and is emitted frontward.

In this case, as shown in FIG. 26, due to a cut-off formed by the shading member 4, the light is emitted frontward within the area of a light distribution pattern L for a so-called low beam. Thus, the vehicle lamp is configured such that it does not give any glaring or dazzling light to oncoming cars and pedestrians, when configured as a headlight.

However, for a vehicle lamp 1 having such a structure, it has not been suitable to employ LEDs as light sources since the lamp comprises an optical system based on a halogen lamp or an electric discharge lamp. It has been difficult to form a desired light distribution pattern with the LEDs. Therefore, it has also been difficult to efficiently use the light irradiated from each of the LEDs and emit the light frontward.

Furthermore, as shown in FIG. 26, a luminous intensity of, for example, 6,000-20,000 cd is preferable for a low beam of a headlight in the vicinity of the central area. In contrast, in an optical system in which light is caused to converge by a projector lens, the value of the luminous intensity is in proportion to the density of light (luminous flux divergence) in the vicinity of a focusing position of the projector lens and the area of the lamp fitting. Therefore, in the case where an LED (which has a considerably lower intensity compared to an electric discharge lamp such as a halogen lamp or an HID lamp) is used as a light source, the optical system becomes considerably large in order to obtain the above-mentioned luminous intensity with a conventional optical system using a reflector and a projector lens as described above.

In the case of a vehicle lamp 1 shown in FIG. 25, the density of light in the vicinity of a focusing position F becomes low as the distance increases between each of the LEDs 2a of the light source module 2 and a focusing position F of the projector lens 3. Therefore, it is difficult to obtain a high luminous intensity. In contrast, as the light source module 2 and the focusing position F are made closer to each other, the number of the LEDs 2a capable of being integrated on the light source module 2 becomes fewer. In this manner, for the vehicle lamp 1, in any case, it is difficult to obtain a desired luminous intensity.

Furthermore, in the case of the vehicle lamp 5 shown in FIG. 27, each of the LEDs 6a of the light source module 6 is projected and enlarged by the reflector 7, and it is difficult to obtain a desired luminous intensity as well.

In contrast, for example, a conventional vehicle lamp 8 shown in FIG. 28 can be considered. In FIG. 28, the vehicle lamp 8 has a structure in which a reflector 9b, a projector lens 9c and a shading member 9d are provided adjacent each of a plurality of LEDs 9a arranged in a matrix of horizontal rows and vertical columns. An image of each of the LEDs 9a is projected frontward by the reflector 9b and a projector lens 9c corresponding to each of the LEDs 9a.

However, for the vehicle lamp 8, the optical system comprising the reflector 9b and the projector lens 9c is also not suitable for employing an LED as the light source because it has a structure based on a halogen lamp or an electric discharge lamp, similar to the case of the vehicle lamp 5 discussed above.

Furthermore, for each of the vehicle lamps 1, 5 and 8, shading members 4 or 9d are provided in order to form a light distribution pattern of a low beam, e.g., a light beam which illuminates more brightly on one side of the road (in the case of driving on the left, the left side) so as not to dazzle or blind the drivers of oncoming cars. By cutting unnecessary light with the shading member 4 or 9d, the vehicle lamps are adapted to obtain the light distribution pattern of the above-mentioned low beam. In this case, in order to form a cut-off against the light distribution pattern of the low beam, it is necessary to form the cut-off with the shading member 4 or 9d at the location in the vicinity of the optical axis of each of the LEDs 2a, 6a and 9a, where the luminous intensity is highest. Therefore, for example, an amount of light close to approximately 40% is cut by the shading member 4 or 9d from the emitted light amount from each of the LEDs 2a, 6a and 9a, resulting in a substantial loss of light. Therefore, the LED's optical characteristic of plane illumination can not be utilized and the efficiency of light use is very low.

On the contrary, when a vehicle lamp is adapted to control its light distribution pattern only with the reflector 7 or 9b without using the shading members 4 and 9d, the efficiency of light use can be increased by up to approximately 70% since the loss can be minimized. However, it is difficult to obtain a sufficient contrast at the border of light and shade on an H line (horizontal line) and elbow line (an inclined line of 15 degrees) since the intensity of each LED is low.

SUMMARY OF THE INVENTION

In view of the foregoing, an aspect of the present invention includes a lamp or vehicle lamp suitable for a headlight, a sub-headlight, tail light, or other vehicle lamp, etc. configured to obtain a desired light distribution pattern using a plurality of LED devices as light sources.

According to another aspect of the present invention there is provided a vehicle lamp that can include a plurality of light source modules each having an LED as a light source; and optical systems for emitting light from each of the light source modules frontward toward predetermined areas of a light distribution pattern, the predetermined areas being different from each other, wherein each of the optical systems can be optimized to emit the light to a predetermined area, and wherein the LEDs of the light source modules can be arranged optimally for the optical systems corresponding thereto.

Preferably, each of the light source modules and each of the optical systems respectively emit light to a converged area and a diverged area of the light distribution pattern. In addition, it is preferable that each of the light source modules and each of the optical systems respectively emit light to a converged area, a diverged area and an intermediate area of the light distribution pattern.

Preferably, the light source module for emitting light to the converged area of the light distribution pattern includes a shading member having a shape similar to that of the light distribution pattern of a low beam, and the optical system corresponding thereto can be composed of a projector lens for converging light.

The light source module for emitting light to the diverged area of the light distribution pattern preferably has a shape for illumination having one linear ridge line and is elongated in one direction, and the optical system corresponding thereto preferably includes a reflector for condensing light from the light source module by reflecting the light.

The optical system for emitting light to the intermediate area of the light distribution pattern is preferably composed of a reflector and a projector lens such that the light distribution characteristics of the converged area and the diverged area are smoothly connected to each other.

The light source module and the optical system can be optimized for emitting light to a light distribution area of a sub-lamp. The light distribution area of the sub-lamp can be a light distribution area of a daytime running lamp, a fog lamp, a cornering lamp, etc.

The light source module and the optical system can be arranged in a removable fashion and optimized for emitting light to an arbitrary or even light distribution area.

Each of the respective light source modules can be configured as a different kind of package as compared to each other, for which the number of LEDs, the arrangement and the composition can be optimized for the light distribution area for each respective light source module in order to efficiently emit light.

According to the above structure, a light distribution pattern can be divided into a plurality of areas, and a light source module and an optical system can be provided for each of the areas. Then, by optimizing each of the light source modules and each of the optical systems for their corresponding area respectively, a light distribution characteristic can be obtained in which each of the areas of the light distribution pattern respectively has desired luminous intensity distribution.

Thereby, the vehicle lamp as a whole can form a desired light distribution pattern having desired luminous intensity distribution by virtue of the plurality of combinations of the light source modules and the optical systems. In this case, by optimizing each of the LEDs of each of the light source modules together with the optical system for their corresponding area of the light distribution pattern, the efficiency of light usage from each of the LEDs can be increased and brighter emitted light can be obtained.

When each of the above light source modules and optical systems emit light respectively to the converged area and the diverged area of the light distribution pattern, they can respectively emit light to the converged area and the diverged area in desired light distribution by optimizing each of the light source modules and each of the optical systems respectively for the converged area and the diverged area of the light distribution pattern. Thereby, as a whole, a light distribution pattern having desired luminous intensity distribution can be formed.

When each of the above light source modules and optical systems emit light respectively to the converged area, the diverged area and an intermediate area of the light distribution pattern, they can respectively emit light to the converged area, the diverged area and the intermediate area in desired luminous intensity distribution by optimizing each of the light source modules and each of the optical systems respectively for the converged area, the diverged area and the intermediate area of the light distribution pattern. Thereby, as a whole, a light distribution pattern having desired luminous intensity distribution can be formed and, at the same time, the converged area and the diverged area can be continuously connected by the intermediate area in a smoothly varying contrast.

In the case where a light source module for emitting light to the converged area of the above light distribution pattern is provided with a shading member having the same shape as that of the light distribution pattern of the low beam, and an optical system corresponding to the module includes a projector lens for converging light, a cut-off can be formed by a shading member. The shading member can be located to block light from each LED of the light source module and, further, the shape of the emission formed by the cut-off can be converged by the projector lens and emitted frontward. Thereby, in a simple structure, it is possible to, for example, form a border of light and shade having a high contrast in the vicinity of the center. Therefore, it is possible to form a light distribution pattern suitable for the converged area.

In the case where a light source module for emitting light to a diverged area of the above light distribution pattern has an illuminating shape having one linear ridge line and is elongated along one direction, and an optical system corresponding to the light source module includes a reflector for reflecting light from the light source module, utilizing, for example, a light source module in which LED chips are arranged in a line, the linear ridge line is reflected by the reflector and emitted frontward. Therefore, the light from the light source module can be efficiently reflected frontward. At the same time, a high-contrast border of light and shade can be formed by projecting the linear ridge line into the vicinity of a cut-off line. Thereby, it is possible to form a light distribution pattern diverging in the horizontal direction (the cut-off line has a difference in light and shade) and suitable for the diverged area. Furthermore, since the light source module is substantially plane-illuminating and fully-diverging illuminating, the reflector does not need to cover the entire light source and can have a substantially planar shape. Therefore, the vehicle lamp can be made thin.

In the case where an optical system for emitting light to the intermediate area of the above light distribution pattern includes a reflector and a projector lens such that the light distribution characteristics of the converged area and the diverged area are connected continuously and smoothly, the light is diverged by the reflector and is converged by the projector lens and emitted frontward while being slightly diverged. Since the cut-off is formed by a shading board at a lens focus, it is possible to smoothly connect a light distribution pattern forming a high-contrast border of light and shade in the converged area with a light distribution pattern diverging horizontally in the diverged area.

Furthermore, in the case where a light source module and an optical system optimized for emitting light to a light distribution area of a sub-lamp are provided and, preferably, the light distribution area of the sub-lamp is a daytime-running lamp distribution area, fog lamp distribution area or a cornering lamp distribution area, the light source module and the optical system can be directly incorporated in the vehicle lamp. Therefore, it is possible to implement a function of a sub-lamp in the vehicle lamp itself, and the entire lamp fitting for a vehicle can be made very small. As a result, the degree of freedom for lamp design and lamp fitting for a vehicle is increased.

Furthermore, in the case where a light source module and an optical system optimized for emitting light to an arbitrary light distribution area are removably arranged, it is possible to add or remove functions of a sub-lamp or other lamp fittings for a vehicle as necessary. Therefore, it is possible to easily manufacture a lamp fitting for a vehicle provided with arbitrary functions.

As indicated, each light source module can be structured as a different kind of package for which the number, the arrangement and the structure of LED chips are optimized, respectively, corresponding to a light distribution area in order to efficiently emit light. Therefore, a vehicle lamp can be made by combining different types of such packages.

In this manner, by virtue of a light source module employing an LED as a light source, light from each of the LEDs can be emitted to a predetermined area in a light distribution pattern through the corresponding optical system. In this case, since the light source module and the optical system are optimized in terms of each corresponding area of the light distribution pattern, it is possible to realize a light distribution characteristic having a desired shape of illumination and intensity distribution.

Therefore, even when an LED, which typically has a lower intensity compared to an electric discharge lamp such as a halogen lamp or an HID lamp, is used as a light source, a sufficient maximum luminous intensity can be obtained. Therefore, it is possible to realize a highly efficient, small and thin vehicle lamp. Furthermore, since a desired light distribution characteristic can be formed by combining light source modules, the degree of freedom of light distribution and the degree of freedom of the design of the vehicle lamp can be increased.

Another aspect of the invention includes a vehicle lamp that has: a first light source module having an LED as a light source; a first optical system located adjacent the first light source module; a second light source module having an LED as a light source; a second optical system located adjacent the second light source module, wherein the first light source module and corresponding first optical system are configured to emit light in a first pattern, and the second light source module and corresponding second optical system are configured to emit light in a second pattern that is different from the first pattern.

The vehicle lamp can also include a first pattern that is not symmetrical and is elbow shaped. In addition, a third light source module can be provided having an LED as a light source; and a third optical system can be located adjacent the third light source module, wherein the third light source module and corresponding third optical system are configured to emit light in a third pattern, and the third pattern being different from the first pattern and the second pattern.

BRIEF DESCRIPTION OF THE DRAWINGS

The above and other objects, aspects, features and advantages of the present invention will become more apparent from the following detailed description when taken in conjunction with the accompanying drawings, in which.

Preferred embodiments of the present invention will be described in detail referring to FIGS. 1-24. Since the embodiments described herein below are preferred specific examples and embodiments of the present invention, there are various technically preferred limitations given thereto. However, the scope of the present invention is not limited to these aspects or limitations unless otherwise described.

Figure 1:
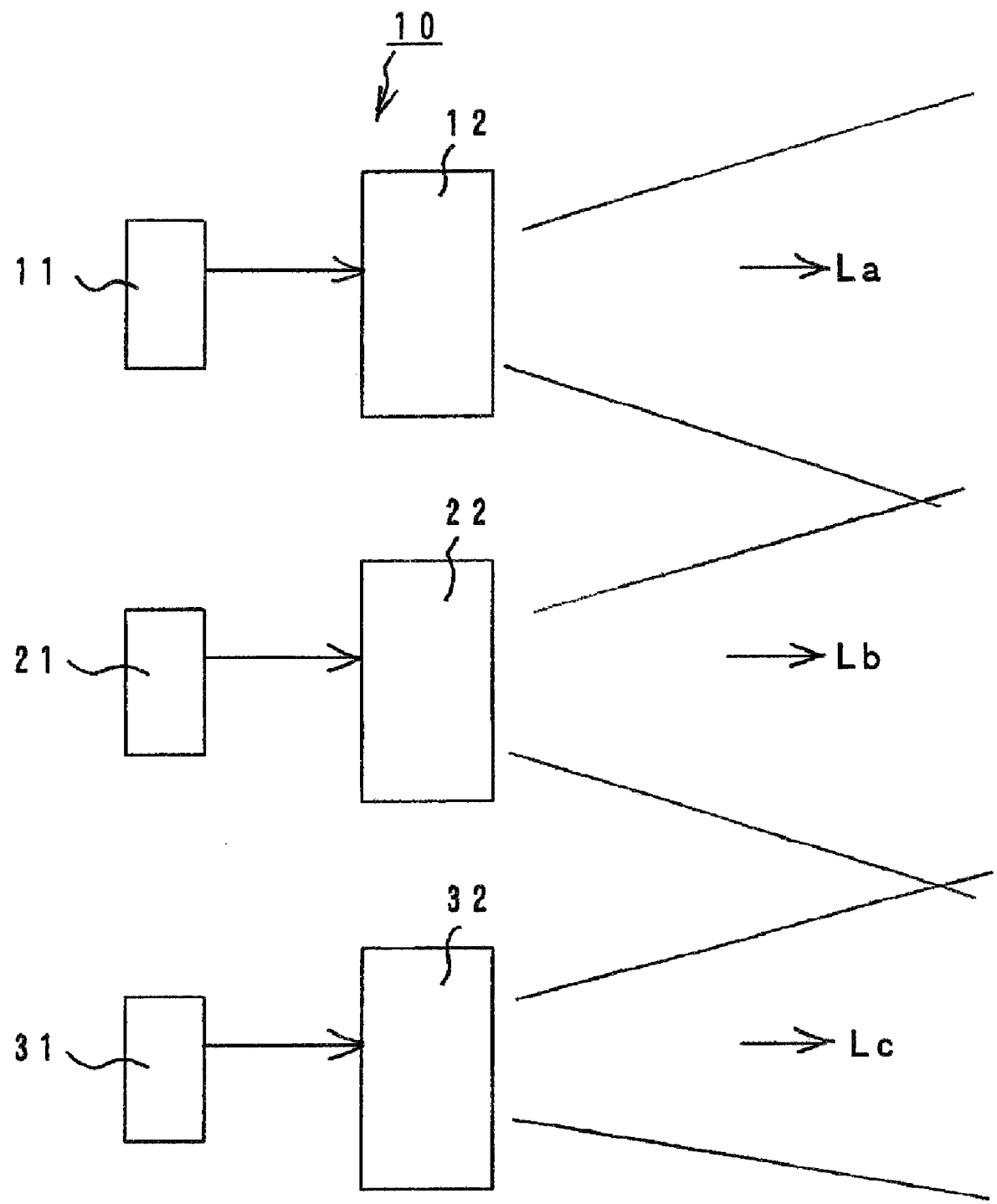
FIG. 1 is a schematic diagram illustrating the composition of an embodiment of a vehicle lamp made in accordance with the principles of the present invention.
Figure 5:
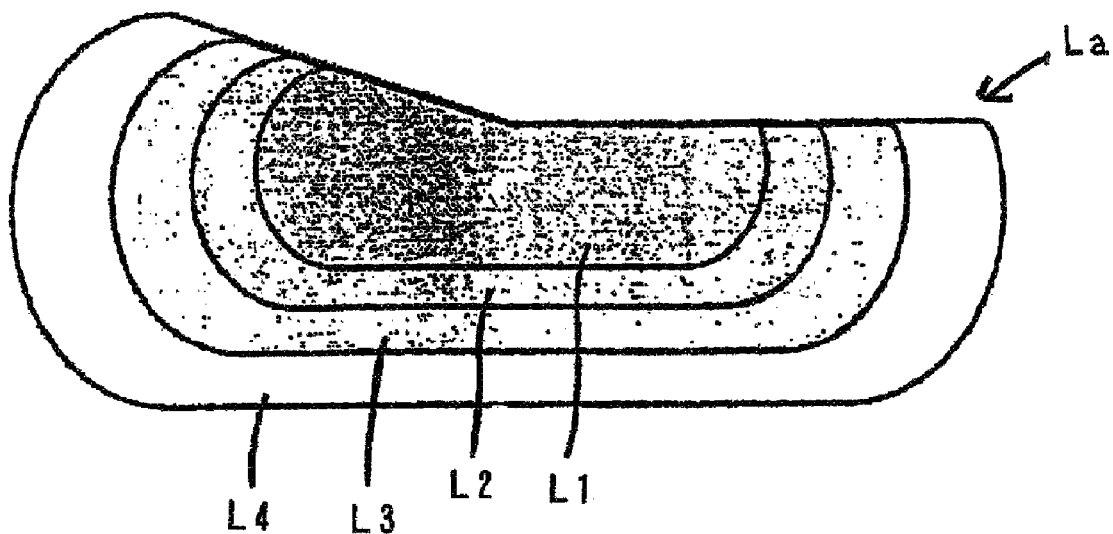
FIG. 5 is a graph showing a light distribution pattern formed by the set of lighting units shown in FIG. 4.

FIG. 1 shows the composition of an embodiment of a vehicle lamp made in accordance with the principles of the present invention. In FIG. 1, a vehicle lamp 10 can include three sets 11, 21 and 31 of lighting units. The first set 11 of the lighting units is preferably adapted to emit light to a converged area having maximal luminous intensity and including borders of light and shade, such as an elbow line that forms a pattern that is elbow shaped 111 (an example of which is shown in FIG. 5), in a light distribution pattern of a so-called low beam.

The second set 21 of the lighting units can be adapted to emit light to a diverged area. The diverged area being a wide area for which no elbow line is necessary, in the above light distribution pattern.

Furthermore, the third set 31 of lighting units can be adapted to emit light to an intermediate area that is located between the above areas such that it smoothly connects the contrast of the light distribution in the above converged area and the diverged area in the above light distribution pattern.

Figure 2:
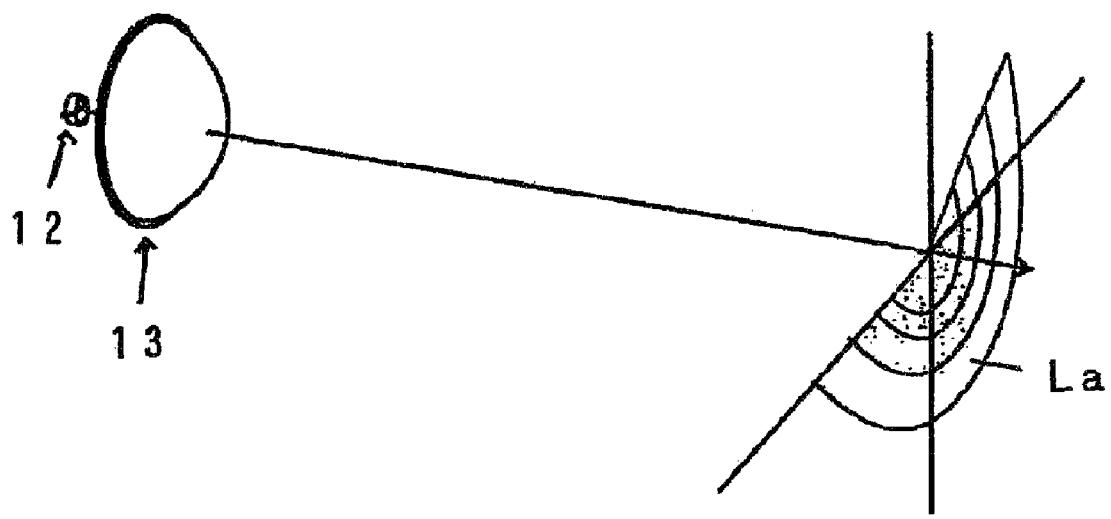
FIG. 2 is a schematic perspective view illustrating the composition of a set of lighting units of the vehicle lamp shown in FIG. 1.
Figure 3:
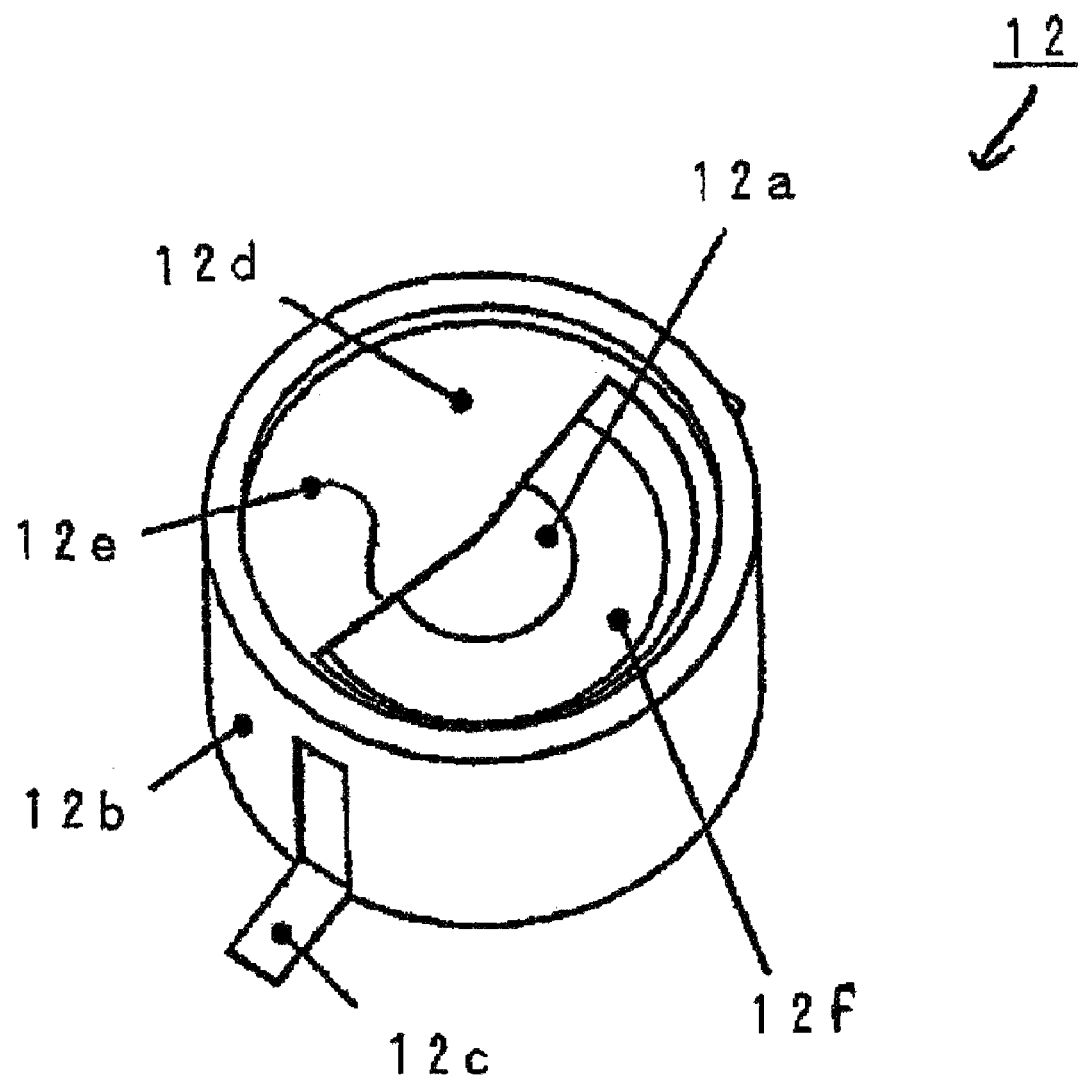
FIG. 3 is an enlarged perspective view illustrating a light source module of the set of lighting units shown in FIG. 2.

First, the first set of the lighting units 11 for the converged area will be described. As shown in FIG. 2, the first set of the lighting units 11 can include a light source module 12 and an optical system 13. As shown in FIG. 3, the light source module 12 can be provided with an illuminating unit 12a that includes an LED formed by surrounding an LED chip with fluorescent material and which can be packaged by a lens house 12b made of, for example, resin. The above illuminating unit 12a can be arranged such that, by being supplied with external power through a lead 12c, light emitted from an LED chip strikes fluorescent material and a mixed-color light that includes both the light emitted directly from the LED chip and the light emitted by excitation of the fluorescent material, is emitted from the illuminating unit 12a. The light source module 12 can also include a core 12f made from a core material, such as a copper core material.

The above described light source module 12 can further be provided with a lens 12d and a shading member 12e located at the front of the illuminating unit 12a. A cut-off can be formed by cutting out or blocking light emitted from the illuminating unit 12a with the shading member 12e. Therefore, by projecting using a horizontal line and a convex lens (projector lens), an elbow line extending obliquely upward at an angle of, for example, 15 degrees from the center, can be formed, which is a characteristic of a light distribution pattern of a low beam.

The above described optical system 13 can be formed as a projector lens that includes a convex lens and, as shown in FIG. 2, arranged such that its optical axis is aligned on the central axis of the light source module 12. The optical system's focusing position can be located on the light source side and positioned in the vicinity of the shading member 12e in front of the illuminating unit 12a of the light source module 12. Thereby, light from each LED 12a of the light source module 12 can be converged frontward by the optical system 13. Therefore, the light can form a light distribution pattern area (converged area) indicated by the symbol "La" in FIG. 2.

Here, since the optical system 13 is preferably a condensing optical system, it is possible to use condensing optical systems having other compositions. However, since the maximum value of luminous intensity in a converged area in a light distribution pattern is preferably in proportion to the intensity in the vicinity of a focus of the secondary optical system, i.e., the optical system 13 and the area of the optical system 13, the maximum intensity can be obtained most efficiently with a composition shown in FIG. 2, in which the illuminating unit 12a of the light source module 12 is projected directly to the converged area by a projector lens.

In contrast, in the case where a focusing position of the projector lens is disposed in the vicinity of the shading member 12e which is located in the vicinity of the outer surface of the lens of the light source module, the intensity is considerably lowered. Therefore, the maximum value of the luminous intensity is also considerably lowered.

In the case of an optical system in which an image of the illuminating unit 12a is imaged in the vicinity of the shading member 12e using a relay lens, and the image is projected toward the converged area by the projector lens, the optical system is complicated, and the cost of parts and cost for assembling are increased. Furthermore, the depth of the whole vehicle lamp is large and the intensity of the image of the illuminating unit 12a at the focusing position is lowered and, therefore, the maximum value of luminous intensity is also lowered.

Figure 4:
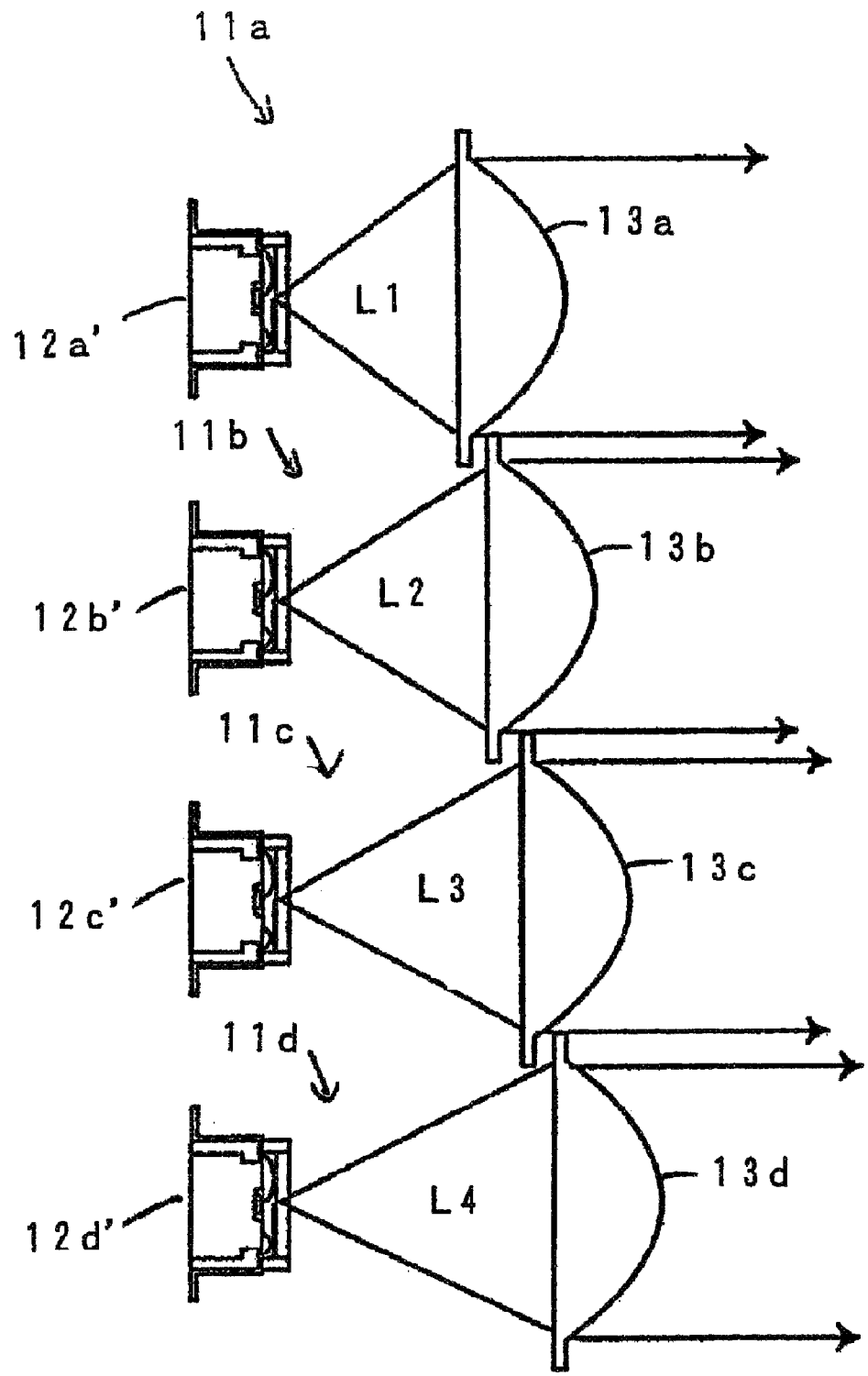
FIG. 4 is a schematic side view illustrating a modification of the set of lighting units shown in FIG. 2.

Here, it is difficult for the first set of the lighting units 11 to give arbitrary or even intensity distribution in the converged area of the light distribution pattern. Therefore, as shown in FIG. 4, by providing the first set of lighting units 11 with a plurality (in the case shown, four (4)) illuminating units 11a, 11b, 11c and 11d, light L1, L2, L3 and L4 from light source modules 12a', 12b', 12c' and 12d' is respectively emitted frontward by optical systems 13a, 13b, 13c and 13d, each having focus distances respectively different from each other. Thereby, as shown in FIG. 5, a light distribution characteristic having intensity distribution, i.e., gradation as a whole, can be provided by setting the range to be emitted for each of the illuminating units 11a, 11b, 11c and 11d to be properly overlapped.

Figure 6:
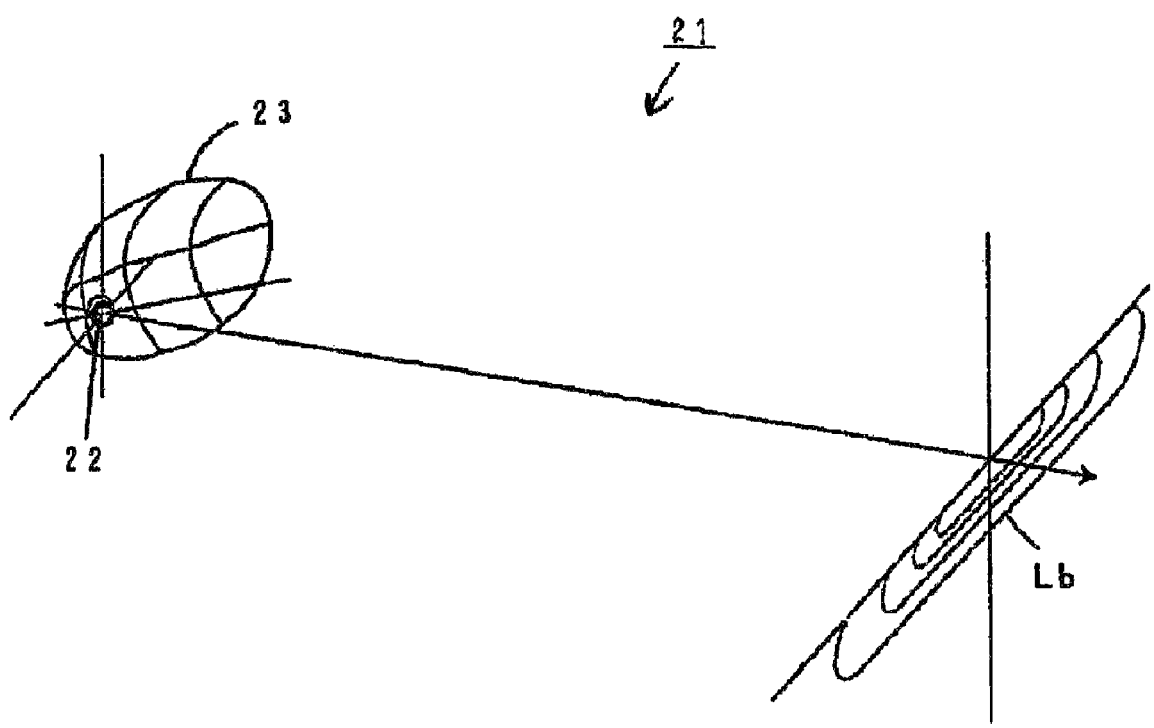
FIG. 6 is a schematic perspective view illustrating another of the lighting units of the vehicle lamp shown in FIG. 1.
Figure 7:
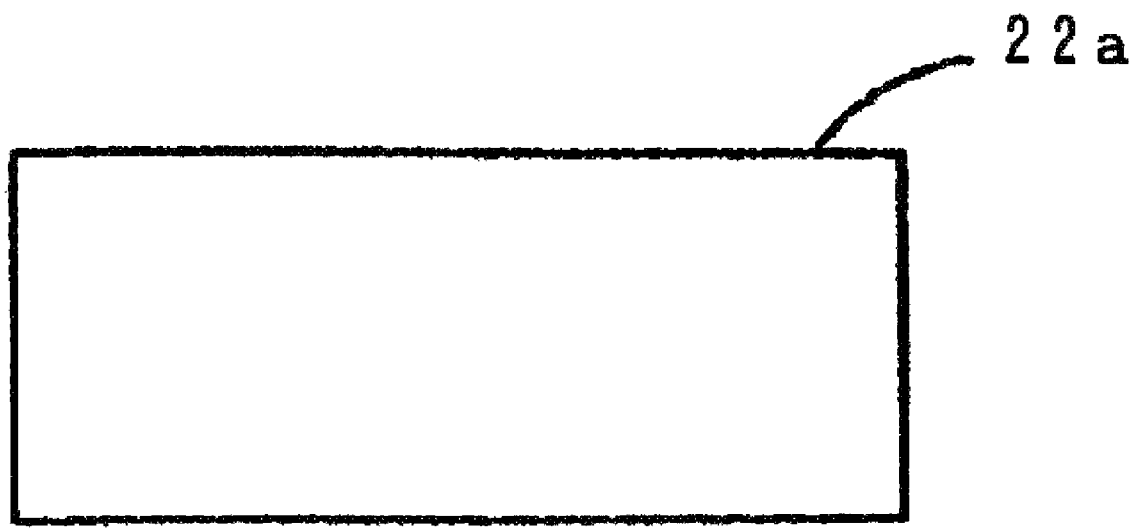
FIG. 7 is a schematic diagram showing an example of the shape of an illuminating unit of a light source module of the set of lighting units shown in FIG. 6.

Next, a set of lighting units 21 for the diverged area will be described. As shown in FIG. 6, the set of lighting units 21 can include a light source module 22 and an optical system 23. The light source module 22 can be provided with an illuminating unit 22a having an illuminating shape having one (1) or more linear ridge line(s) 121 such as, for example, a rectangle composed of an LED.

The optical system 23 can include a reflector having a combination of concave surfaces, e.g., surfaces dented frontward. For example, the reflector can include a combination of a paraboloid of revolution and an ellipsoid of revolution and can be arranged such that its focusing position is positioned in the vicinity of the illuminating unit 22a of the light source module 22 opposing over the axis of the light source module 22. Thereby, light from the illuminating unit 22a of the light source module 22 can be reflected by the optical system 23 and can form the light distribution pattern area (diverged area) indicated by the symbol "Lb" in FIG. 6.

The light source module 22 can be plane-illuminating and, utilizing the advantage of having Lambertian directivity, the efficiency of light use emitted from the illuminating unit 22a of the light source module 22 can be approximately 70% or more. A desired light distribution pattern can be formed by properly selecting the shape of the reflector.

Figure 8:
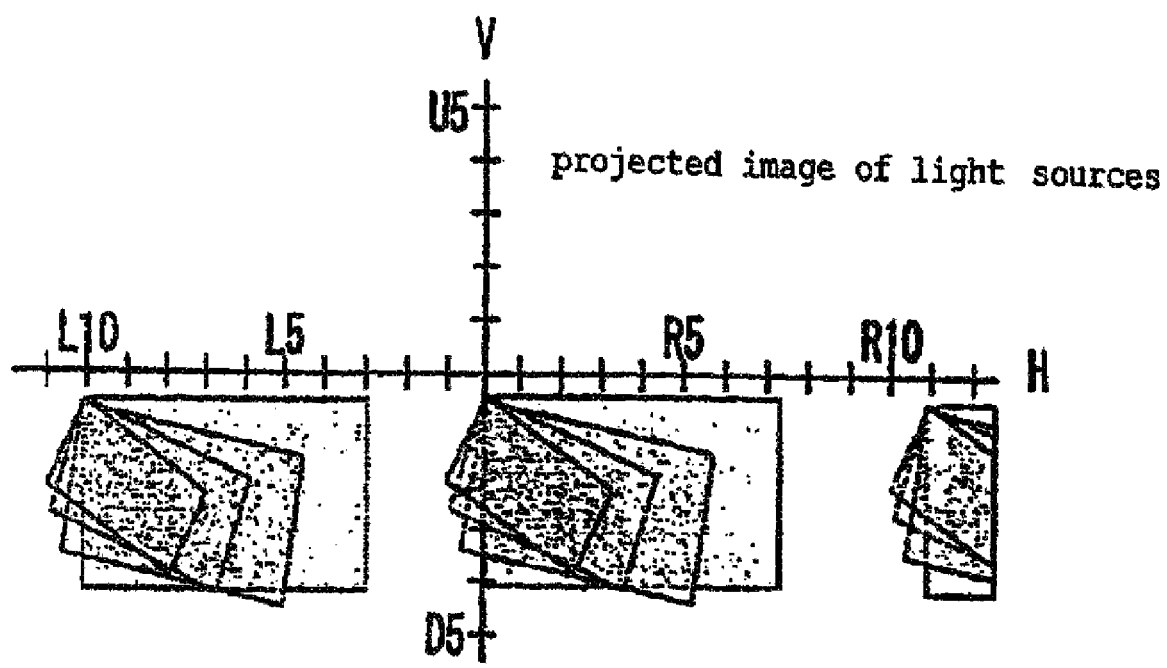
FIG. 8 is a schematic diagram showing a projected image of the light source of the set of lighting units shown in FIG. 6.
Figure 9:
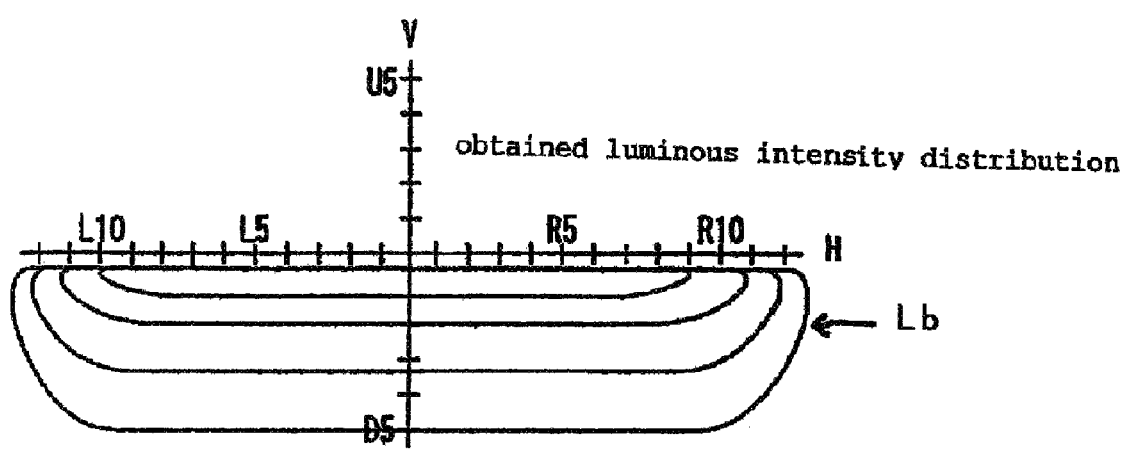
FIG. 9 is a graph showing a light distribution pattern formed by the set of lighting units shown in FIG. 6.

By projecting light frontward by the optical system 23 by arranging the linear ridge line 121 of the illuminating unit 22a of the light module 22 in a horizontal direction, the ridge line 121 can form a cut-off for a horizontal line of the light distribution pattern. Furthermore, the set of lighting units 21 preferably includes an optical system 23 that has a multi-reflector divided into a plurality of reflecting faces. By forming each of the reflecting faces properly, the illuminating unit 22a of the light source module 22 can be projected as shown in FIG. 8. Thus the projected image of the illuminating unit 22a can be rotated depending on the position where light is reflected. Thereby, the diverged area of the light distribution pattern can be provided with a light distribution characteristic having intensity distribution, i.e., gradation, as shown in FIG. 9, by allowing projected images of the illuminating unit 22a formed by each reflecting face to overlap each other.

Figure 10:
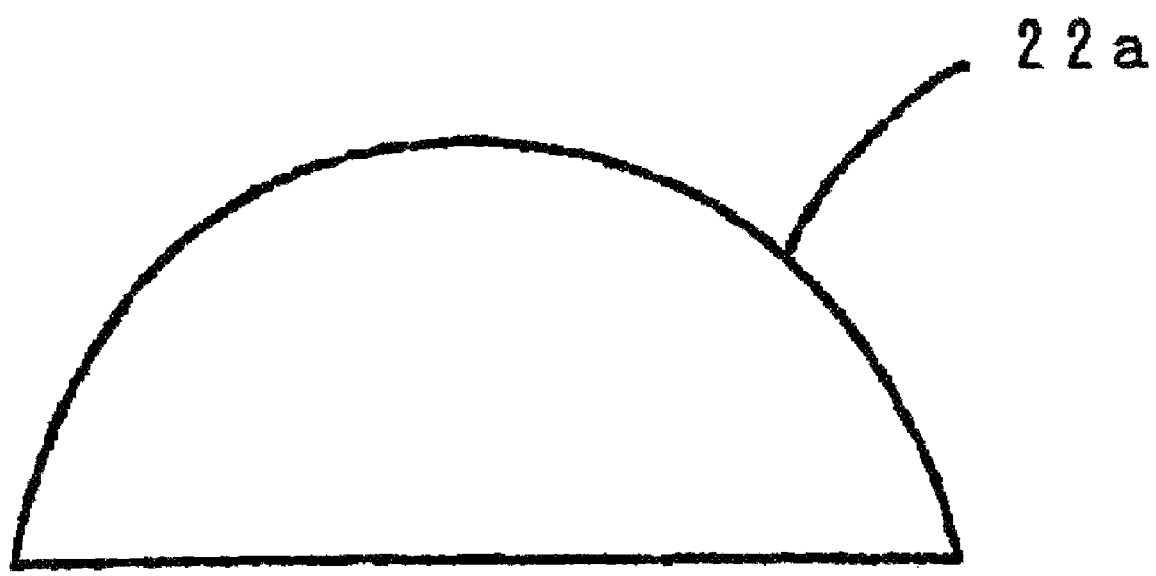
FIG. 10 is a schematic diagram showing another example of the shape of the illuminating unit of the light source module of the set of lighting units shown in FIG. 6.
Figure 11:
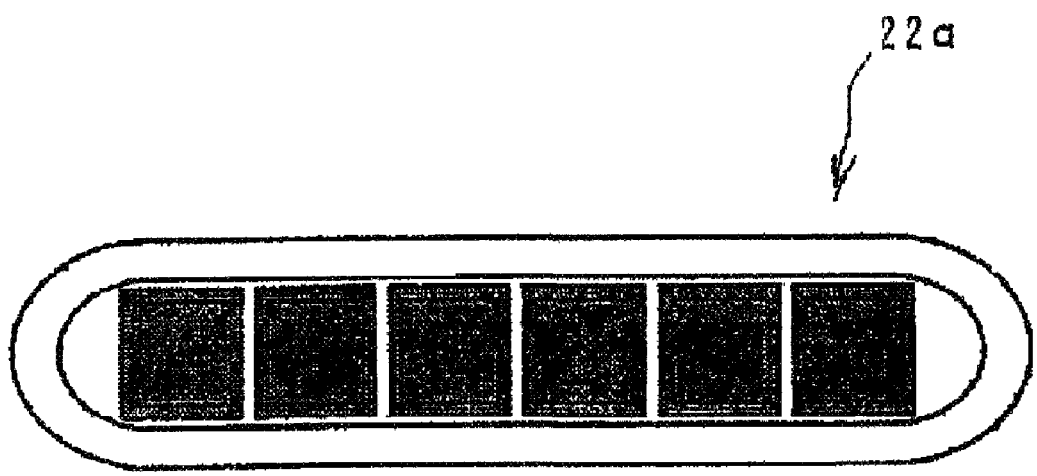
FIG. 11 is a schematic view showing yet another example of the shape of the illuminating unit of the lighting source module of the set of lighting units shown in FIG. 6.

The shape of the illuminating unit 22a of the light source module 22 is not limited to a rectangle and, as shown in FIG. 10, may be formed such that it has an outer shape of an approximate semicircle. As shown in FIG. 11, the shape of the illuminating unit 22a can be formed such that a plurality of LED chips are lined up in a particular direction.

Figure 12:
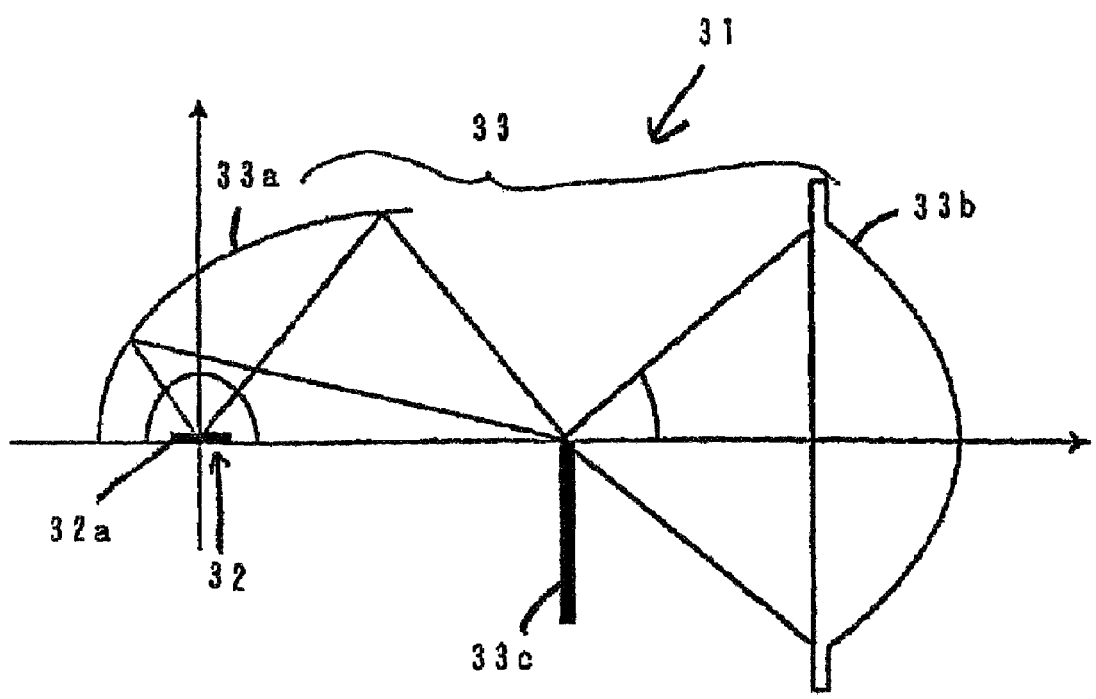
FIG. 12 is a schematic side view illustrating another of the lighting units of the vehicle lamp shown in FIG. 1.

Another set of lighting units 31 will now be described. As shown in FIG. 12, a set of lighting units 31 can include a light source module 32 and an optical system 33. The light source module 32 can have a composition that does not include the shading member 12e from the light source module 12 in FIG. 2. The surface of the illuminating unit 12a can be arranged along the optical axis of the optical axis of the optical system 33.

There is no limitation for the shape of the illuminating unit 32a of the light source module 32. However, it is preferable that the illuminating unit 32a be as small and as high-intensity as possible in order to improve the efficiency of incidence to a projector lens 33b of the optical system 33, and to further downsize the size of the optical system 33.

The optical system 33 can include a reflector 33a, a projector lens 33b and a shading member 33c. The reflector 33a can include, for example, an ellipsoid of revolution and can be arranged such that a focusing position on one hand is positioned in the vicinity of the center of the illuminating unit 32a of the light source module 32, and the other focusing position on the other hand can be positioned in front on the optical axis of the optical system 33.

The projector lens 33b can be a convex lens and can be arranged such that its focusing position on the light source side is positioned in the vicinity of a focusing position on the front side of the reflector 33a. Furthermore, the shading member 33c can be arranged in the vicinity of a focusing position on the light source side of the projector lens 33b and its edge 33d can be adapted to form a cut-off with its upper end.

Figure 13:
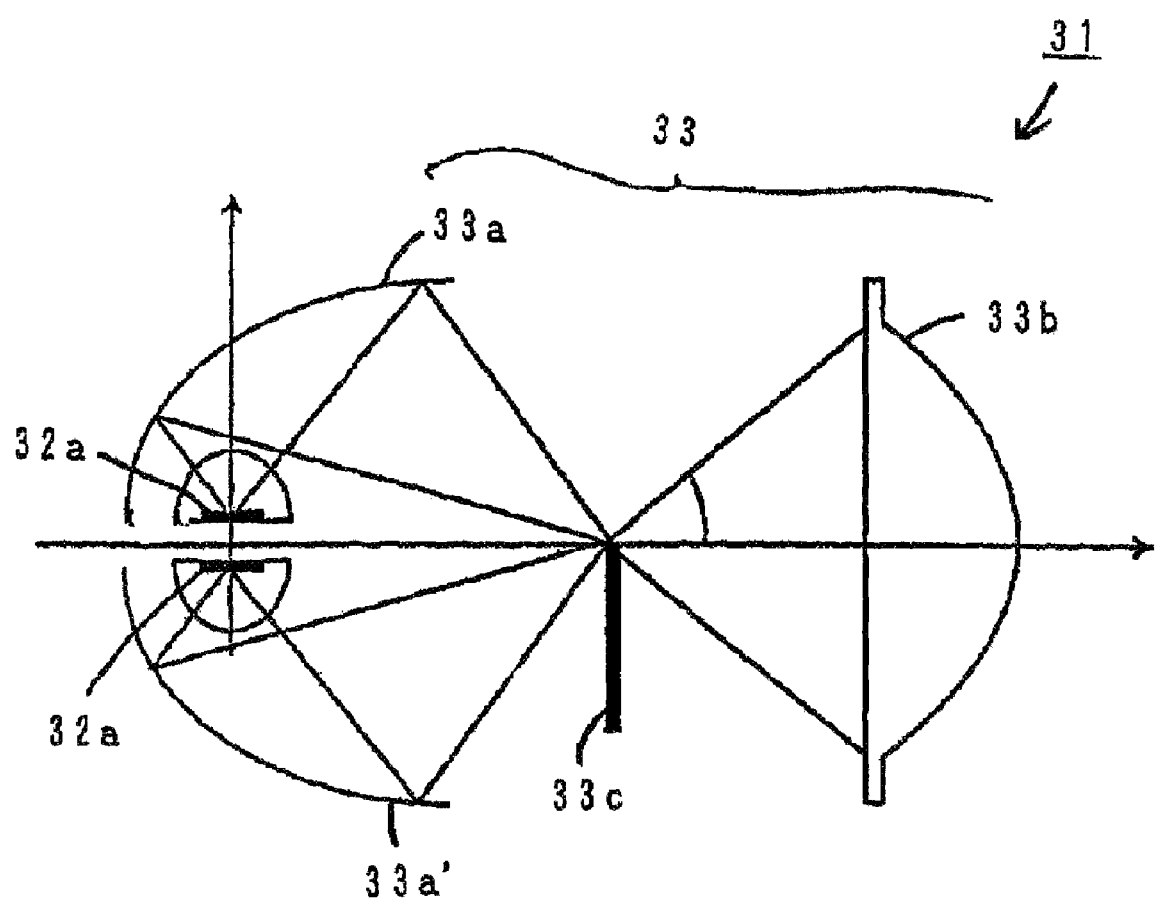
FIG. 13 is a schematic side view illustrating another embodiment of the lighting unit of the vehicle lamp shown in FIG. 1.

In the composition described above, the illuminating unit 32a is preferably arranged facing upward and the reflector 33a is preferably arranged in the upper half portion. However, the composition is not limited to this configuration and, as shown in FIG. 13, in addition to the above illuminating unit 32a, a reflector 33a' facing downward may be provided along with a reflector 33a' in the lower half portion facing vertically to the reflector 33a.

Figure 14:
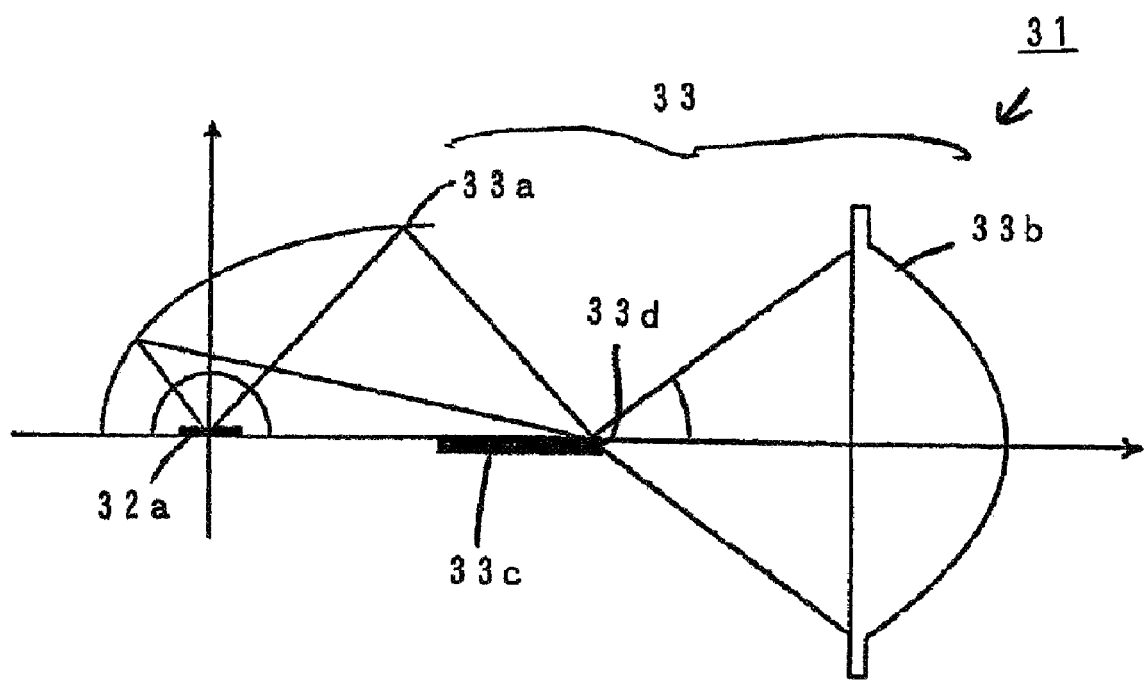
FIG. 14 is a schematic side view illustrating yet another embodiment of the lighting unit of the vehicle lamp shown in FIG. 1.

Furthermore, as shown in FIG. 14, a shading member 33c may be arranged along the optical axis to form a cut-off with the front end of its edge 33d. Thereby, light incident to a portion of the surface of the shading member 33d can be reflected and emitted frontward. Accordingly, the efficiency of light use can be improved by 50% or more.

Figure 15:
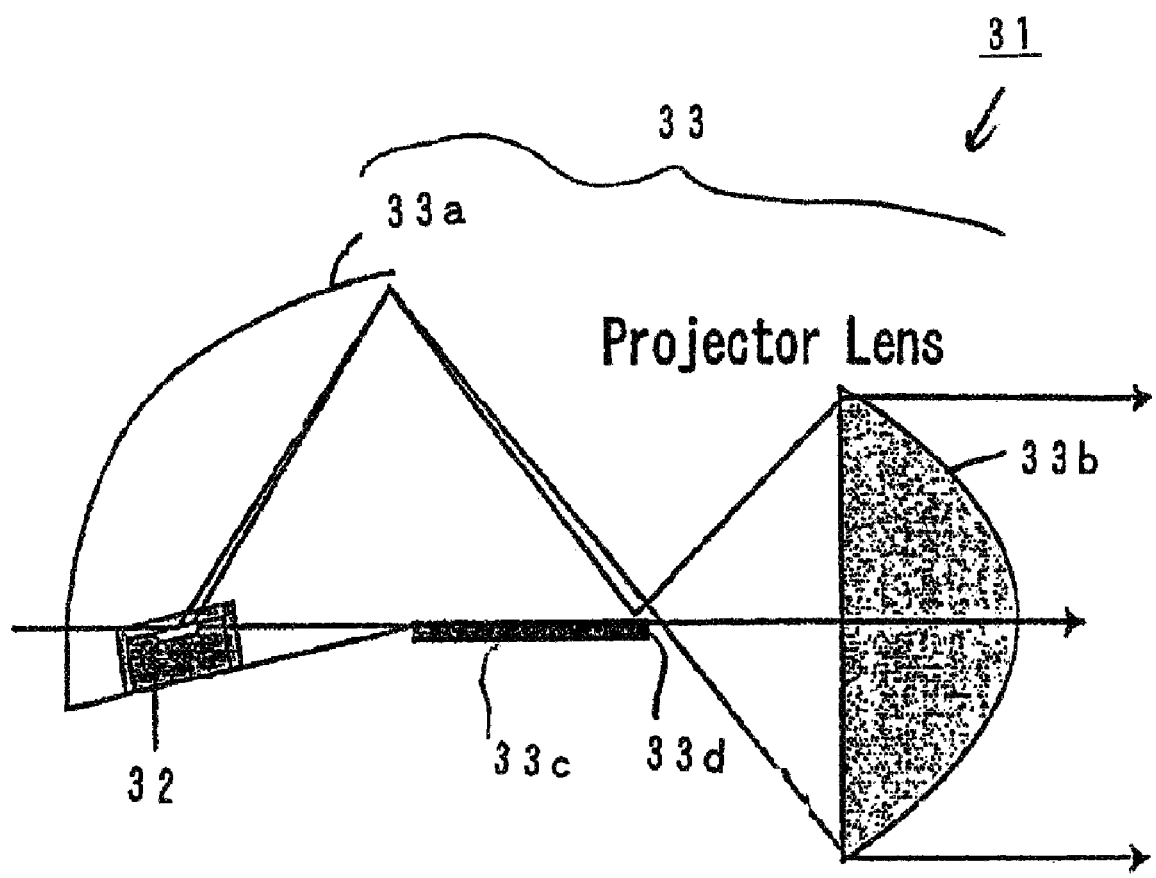
FIG. 15 is a schematic side view illustrating a modification of the embodiment of the lighting unit shown in FIG. 12.

As shown in FIG. 15, in order to improve the contrast at the cut-off line, the illuminating unit 32a may be arranged to be slightly inclined backward.

Figure 16:
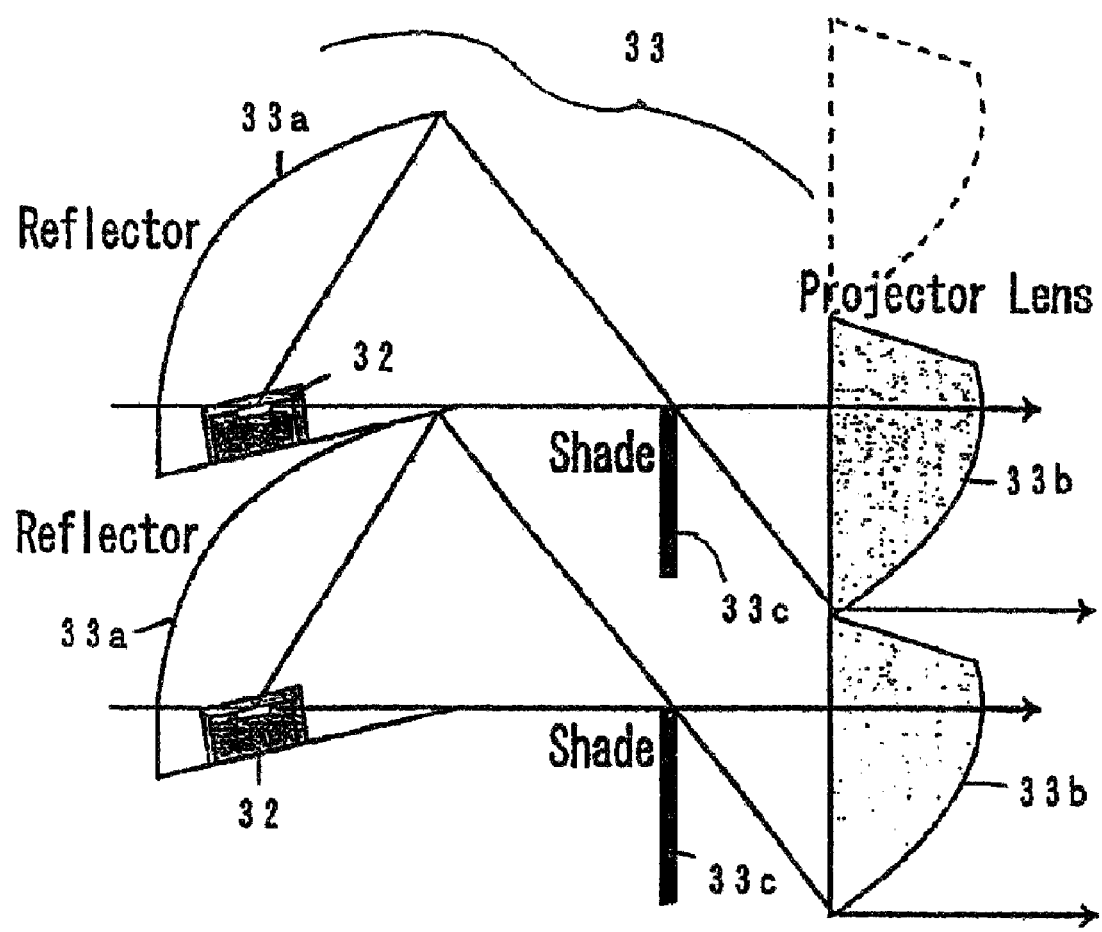
FIG. 16 is a schematic side view illustrating another modification of the embodiment of the lighting unit shown in FIG. 12.

In the optical system shown in FIG. 16, the LED light source can be plane-illuminating and, when the reflecting faces are either present only above or below the center of the lens, light is incident to either an area below or above the center of the projector lens 33b. Therefore, by cutting off the upper half portion or the lower half portion of the projector lens 33b, downsizing in the vertical direction can be facilitated. In addition, when a plurality of lighting units 31 are arranged to vertically overlap each other in order to obtain a light distribution pattern having a higher intensity, they can be arranged more densely in the vertical orientation.

The vehicle lamp 10 according to embodiments of the present invention can include lighting units 11, 21 and 31 which are illuminated by being supplied with power, respectively. Thereby, the light irradiated from the illuminating unit 12a of the light source module 12 can have the cut-off formed by the shading member 12e and be condensed by the projector lens of the optical system 13, and can be emitted frontward to form the converged area "La" of the light distribution pattern.

The light irradiated from the illuminating unit 22a of the light source module 22 can be emitted frontward by being reflected by the reflector of the optical system 23 and can thus form the diverged area "Lb" of the light distribution pattern.

Furthermore, the light irradiated from the illuminating unit 32a of the light source module 32 can be reflected by the reflector 33a of the optical system 33, can be further converged by the projector lens 33b and be concurrently given the cut-off formed by the shading member 33c, and can be emitted frontward to form the intermediate area between the converged area "La" and the diverged area "Lb."

Thereby, the reflected light from each of the lighting units 11, 21 and 31 can overlap each other and can form the light distribution pattern of a so-called low beam. The plurality of areas of the light distribution pattern, i.e., the converged area, the diverged area and the intermediate area can be respectively formed by the lighting units 11, 21, and 31. Here, since each of the lighting units 11, 21 and 31 is optimized for its respective corresponding area, each of the areas and the whole light distribution pattern can be formed in a desired luminous intensity distribution and at maximum luminous intensity. In this manner, a desired light distribution pattern such as, for example, a light distribution of a so-called low beam can be obtained using a plurality of LEDs as the vehicle lamp's light source.

Figure 17:
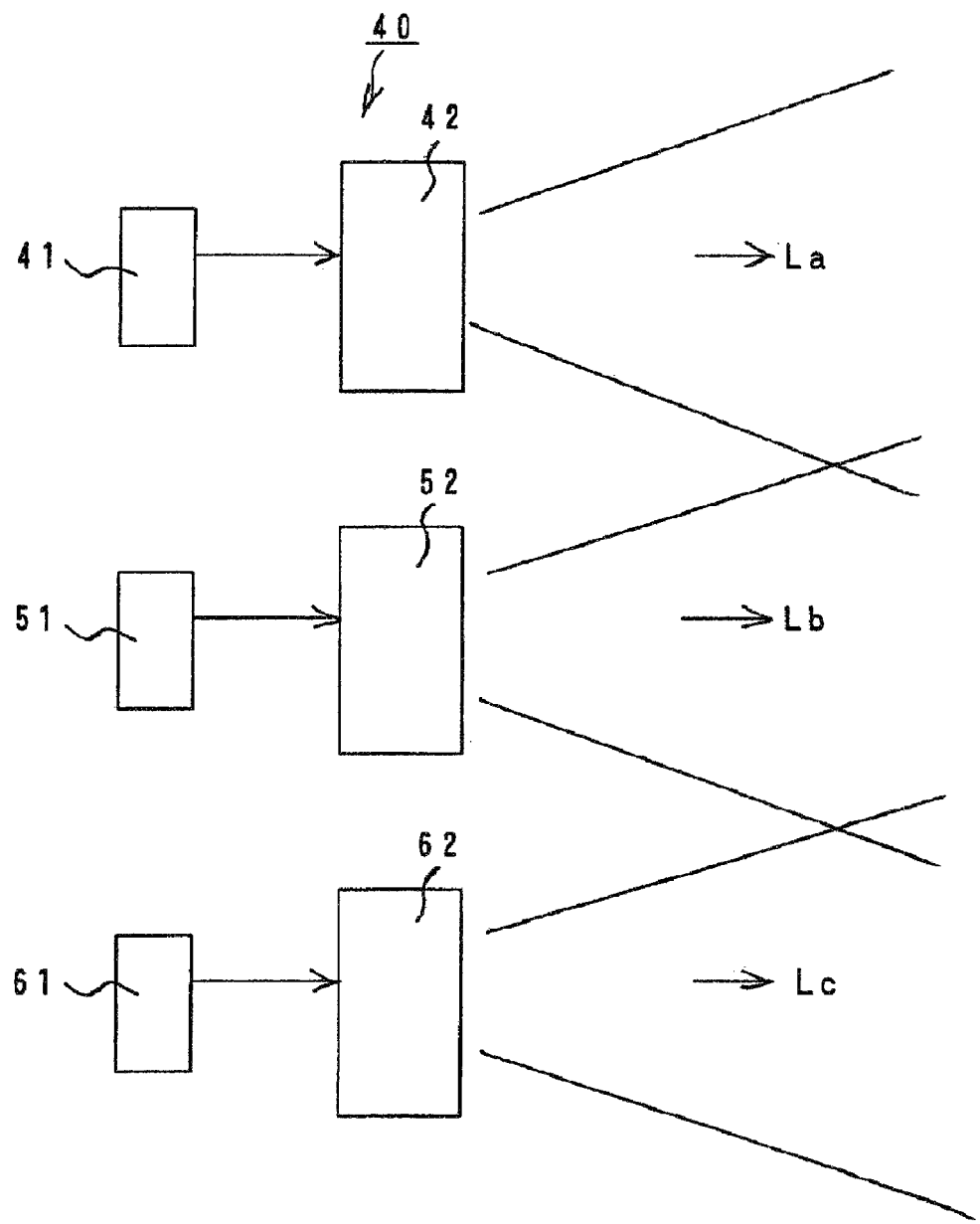
FIG. 17 is a schematic diagram showing the composition of another embodiment of a vehicle lamp made in accordance with the principles of the present invention.

FIG. 17 shows the composition of another embodiment of a vehicle lamp made in accordance with the principles of the present invention. In FIG. 17, vehicle lamp 40 is a specific embodiment of the vehicle lamp 10 described above. Similar to the vehicle lamp 10 shown in FIG. 1, the vehicle lamp 40 can include three sets of lighting units 41, 51 and 61.

A first set of lighting units 41 corresponding to a converged area can be composed to be almost the same as the set of lighting units 11 of the vehicle lamp shown in FIG. 1 and can be adapted to emit light to the range from 8 degrees on the left to 8 degrees on the right.

The set of lighting units 51 corresponding to a diverged area can be composed to be almost the same as the set of lighting units 21 of the vehicle lamp shown in FIG. 1 and can be adapted to emit light to the range from 50 degrees on the left to 50 degrees on the right.

Furthermore, the lighting units 61 corresponding to an intermediate area can be composed to be almost the same as the set of lighting units 31 of the vehicle lamp shown in FIG. 1 and can be adapted to emit light to the range from 20 degrees on the left to 20 degrees on the right.

The light distribution ratio (luminous flux ratio) for each of the areas, i.e., the converged area, the intermediate area and the diverged area is set preferably at 1:2:4.

Figure 18:
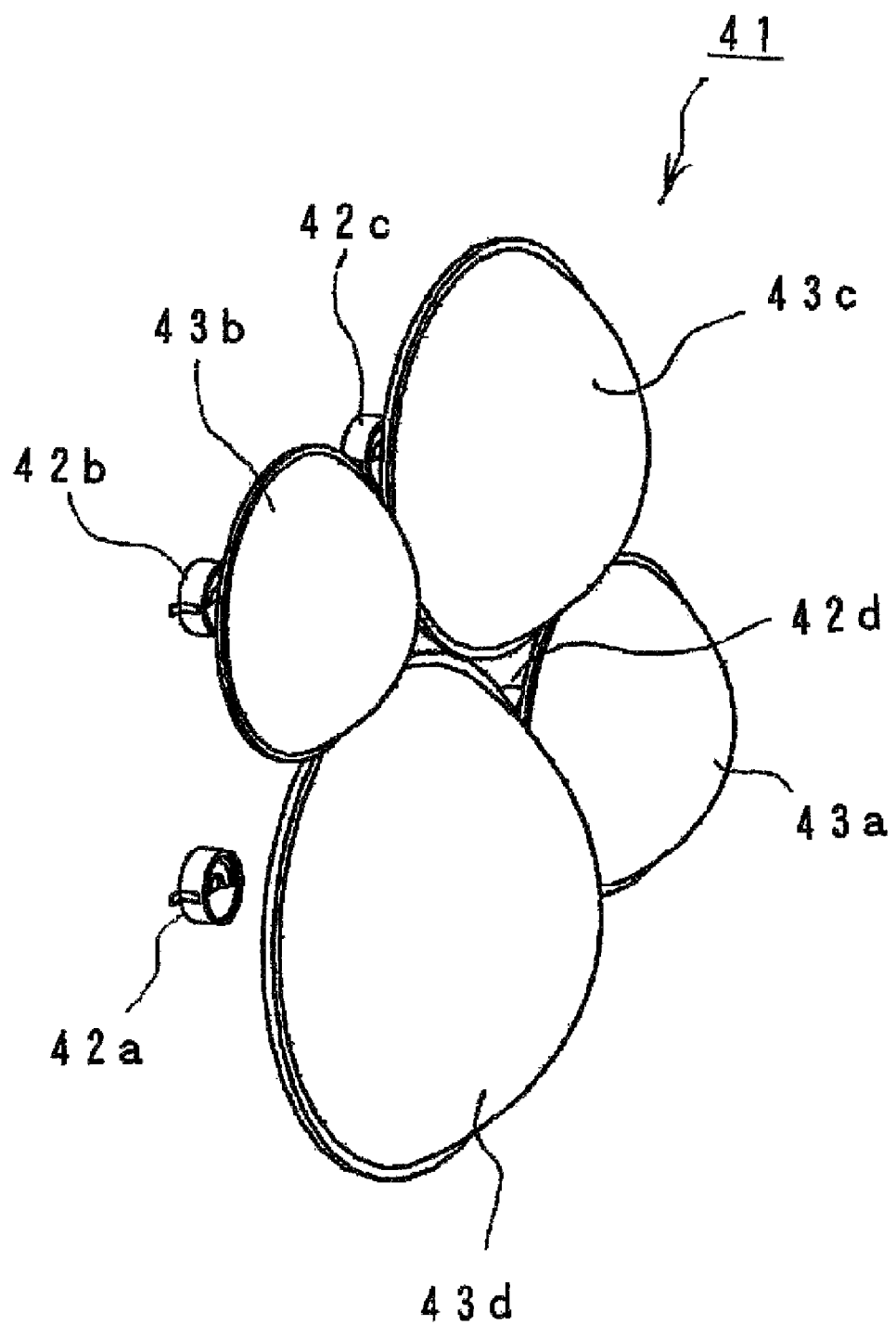
FIG. 18 is a schematic perspective view illustrating a set of lighting units for a vehicle lamp as shown in FIG. 17.

As shown in FIG. 18, the set of lighting units 41 can include a plurality (in the case shown, four (4)) of light source modules 42a, 42b, 42c and 42d, and projector lenses 43a, 43b, 43c and 43d, respectively, corresponding to the light source modules. Each of the light source modules 42a, 42b, 42c and 42d are preferably composed to be almost the same as the light source modules of the set of lighting units 11 of the vehicle lamp 10.

Each of the projector lenses 43a, 43b, 43c and 43d can have the same composition as that shown in FIG. 4 and can each have a focusing position that is different from the other lenses, and can each have a focusing distance different from the other lenses. A luminous intensity and a projection size on a screen can be obtained by properly selecting the focusing distance of each of the projector lenses 43a, 43b, 43c and 43d.

Figure 19:
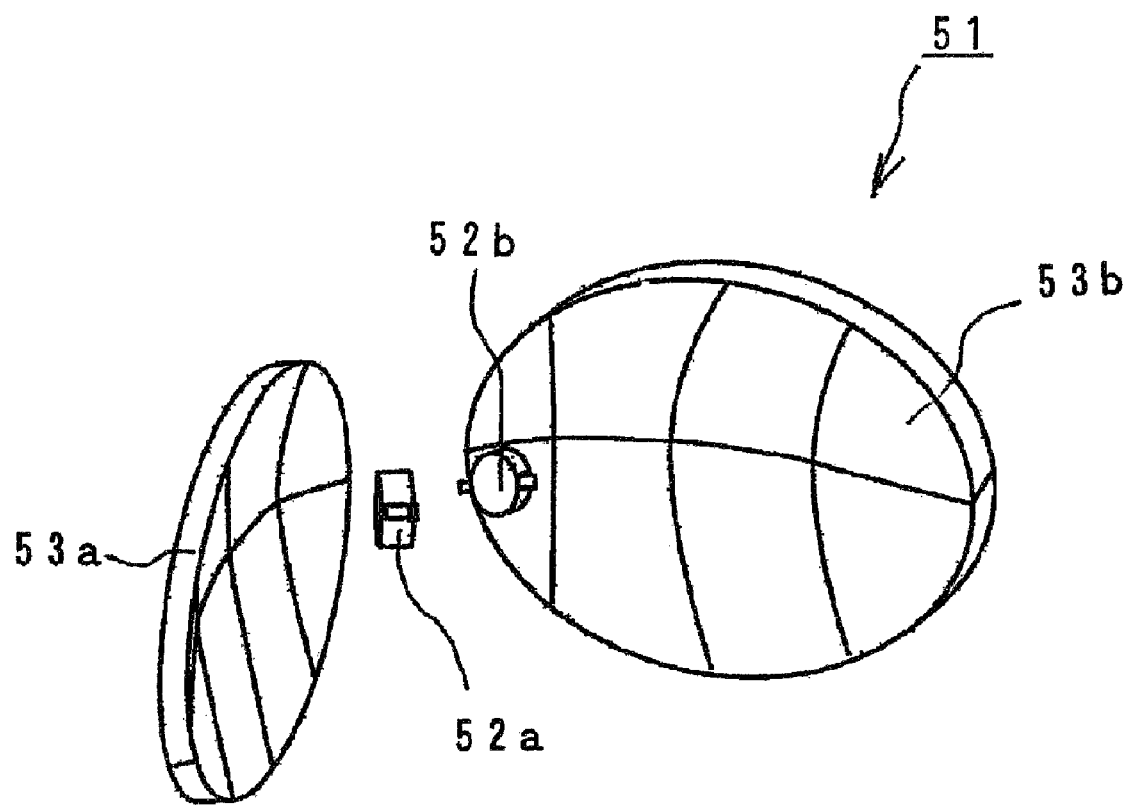
FIG. 19 is a schematic perspective view illustrating another set of lighting units for a vehicle lamp as shown in FIG. 17.

As shown in FIG. 19, the set of lighting units 51 can include a plurality (in the case shown, two (2)) of light source modules 52a and 52b, and reflectors 53a and 53b corresponding to the light source modules 52a and 52b. Each of the light source modules 52a and 52b can be configured to be similar to the light source module 22 in the set of lighting units 21 of the vehicle lamp 10, and can be arranged back-to-back in the direction from right to left.

Here, an illuminating unit of each of the light source modules 52a and 52b can have one (1) or more linear ridge lines, for example, ridge lines formed as a rectangle, and the ridge line(s) can be longer than a filament of a halogen lamp or an arc electrode dimension and preferably have a length that is twice as long as the filament. As shown in FIG. 11, by using a light source package formed with a plurality of LED chips of a so-called multi-chip type arranged linearly in a package, the luminous flux of the light source package itself can be increased and the size of the vehicle lamp can be minimized.

Furthermore, each of the reflectors 53a and 53b can be composed similar to the reflector 23 in the set of lighting units 21 of the vehicle lamp 10 and can be configured to spread light in the rightward and leftward directions. Thus, even when the illuminating units of respective light source modules 52a and 52b have a relatively long linear ridge line, the position of the projected image of the illuminating units can be arbitrarily controlled based on the shape of reflectors 53a and 53b, and 70% or more of the luminous flux from the illuminating units can be emitted frontward.

Figure 20:
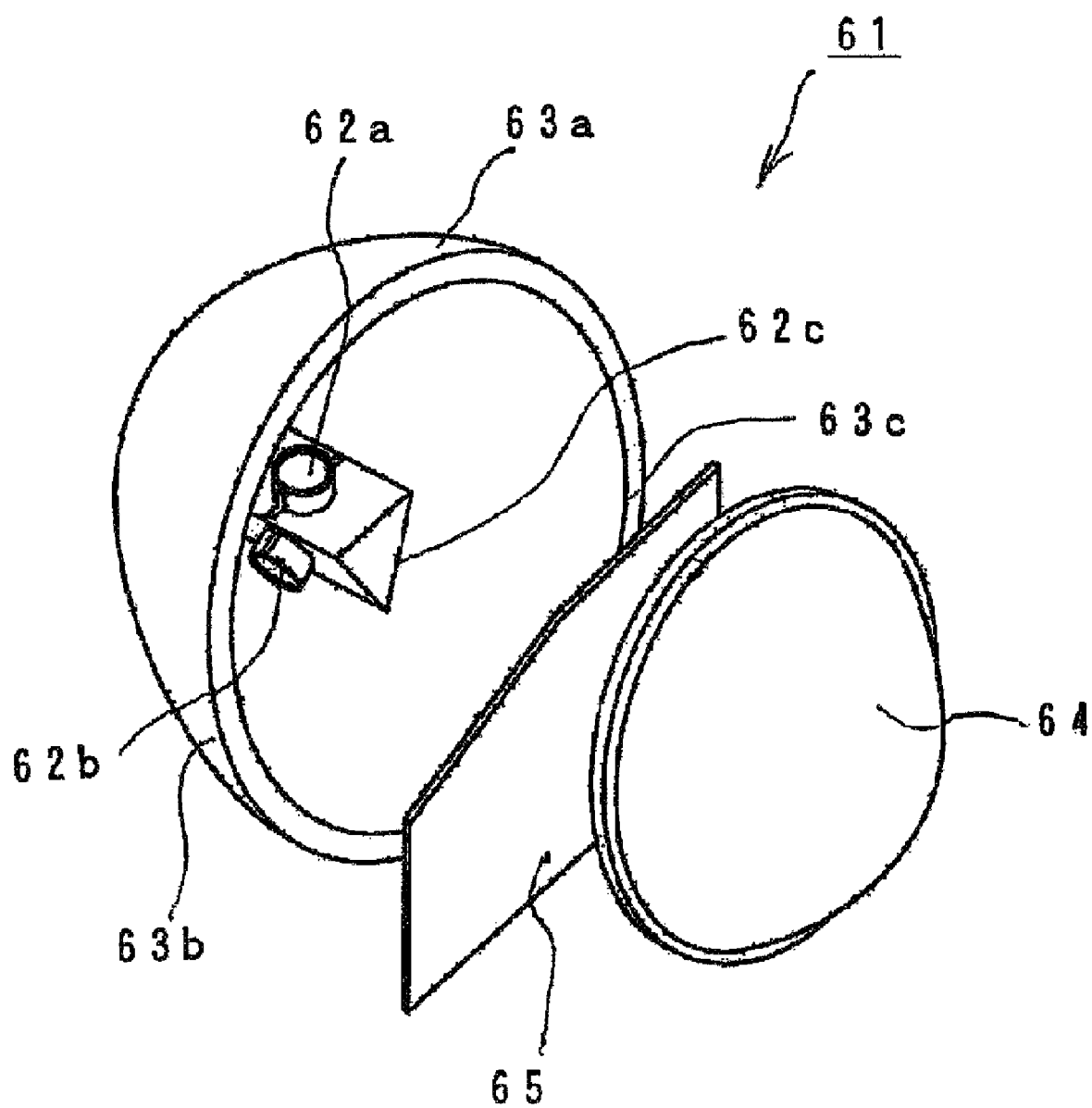
FIG. 20 is a schematic perspective view illustrating yet another set of lighting units for a vehicle lamp as shown in FIG. 17.

As shown in FIG. 20, the set of lighting units 61 can include a plurality (in the case shown, three (3)) of light source modules 62a, 62b and 62c, reflectors 63a 63b and 63c respectively corresponding to the light source modules, one (1) projector lens 64 and a shading member 65. Each of the light source modules 62a, 62b and 62c can be respectively composed similar to the light source module 32 as shown in the set of lighting units 31 of the vehicle lamp 10, and can be arranged around the central axis and spaced from each other by the same degree. An illuminating unit of each of the light source modules 62a, 62b and 62c is preferably selected to be as small as possible, for example, smaller than the filament of a conventional halogen lamp or the arc electrode dimension of an HID.

Each of the reflectors 63a, 63b and 63c can be configured similar to the reflector 33a in the set of lighting units 31 of the vehicle lamp 10, and can be arranged above and on both sides of the optical axis corresponding to each of the light source modules 62a, 62b and 62c. Furthermore, the projector lens 64 can be similar to the projector lens 33b in the set of lighting units 31 of the vehicle lamp 10, and preferably only one projector lens 64 is arranged on the optical axis.

The shading member 65 can also be configured similar to the shading member 33c of the set of lighting units 31 of the vehicle lamp 10, and can be arranged in the vicinity of a focusing position on the light source side of the projector lens 64.

In the case where the light source module has a linear illuminating unit, in order to form a light distribution pattern that spreads in the rightward and leftward directions, it is desirable that the light source module correspond to a reflector positioned above the optical axis and be arranged such that the longitudinal direction of the illuminating unit is substantially perpendicular to the optical axis. Furthermore, it is desirable that the light source module that corresponds to a reflector positioned on the side of the optical axis be arranged such that the longitudinal direction of the illuminating unit is parallel to the optical axis. Thereby, the projected image of the illuminating unit that is formed by the reflector extends horizontally and, therefore, a light distribution pattern can be easily formed.

Figure 21:
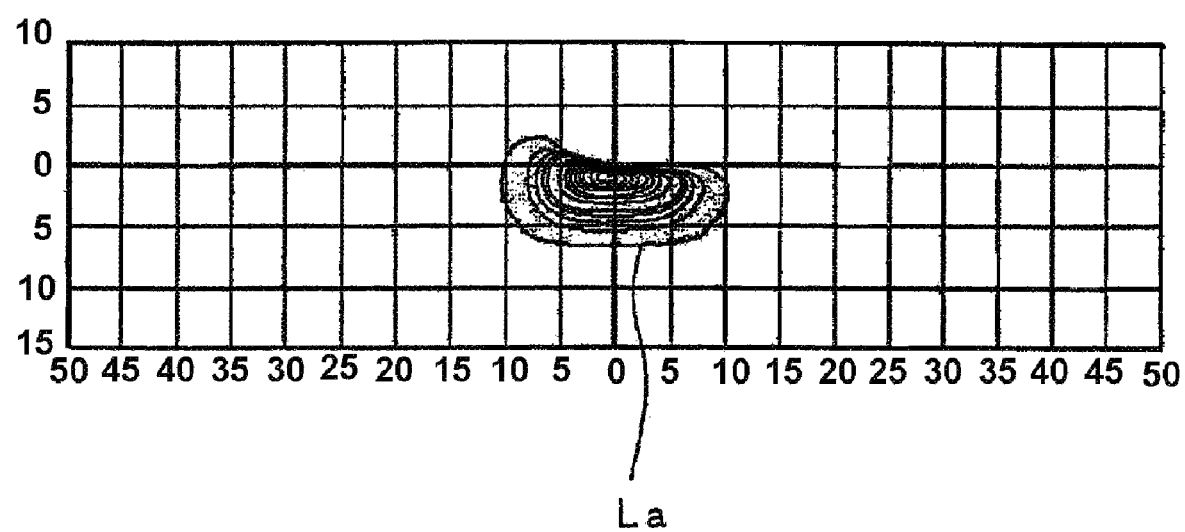
FIG. 21 is a graph showing a light distribution pattern formed by the set of lighting units as shown in FIG. 18.
Figure 22:
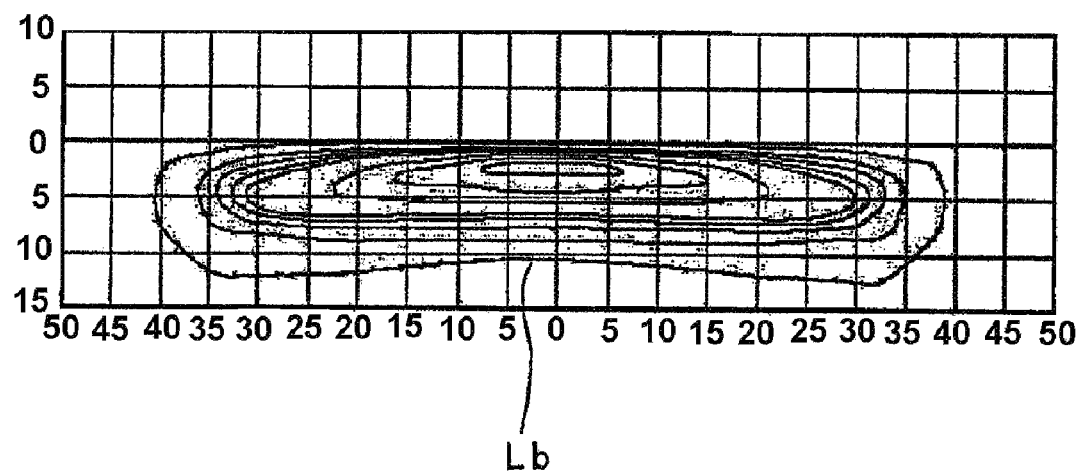
FIG. 22 is a graph showing a light distribution pattern formed by the set of lighting units as shown in FIG. 19.
Figure 23:
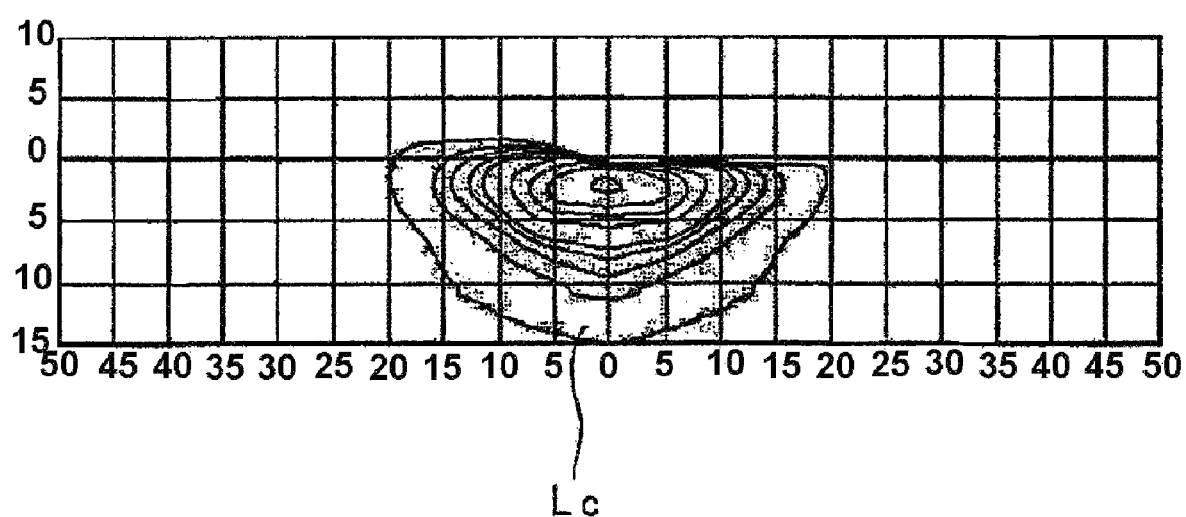
FIG. 23 is a graph showing a light distribution pattern formed by the set of lighting units as shown in FIG. 20.
Figure 24:
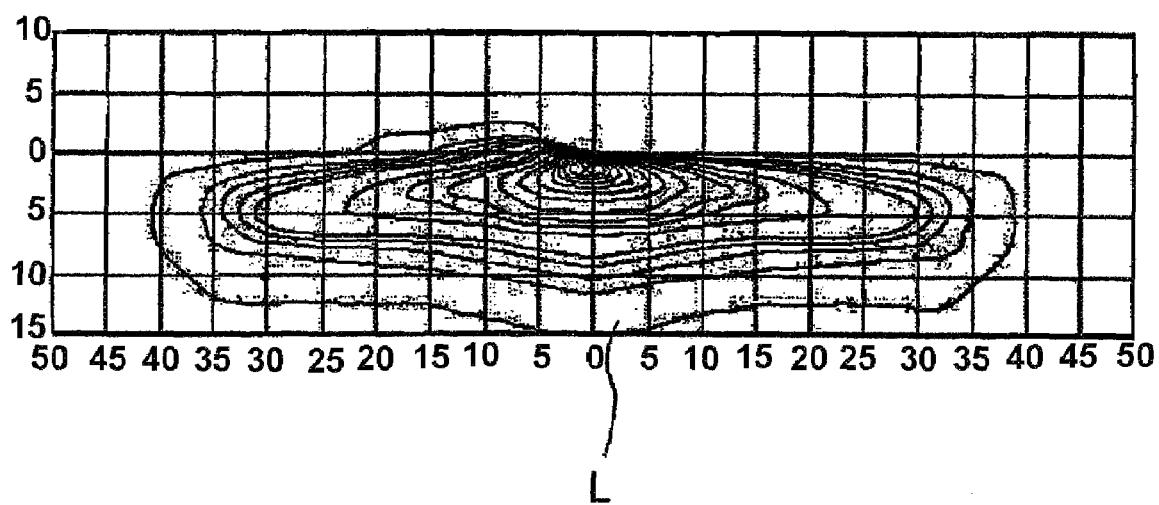
FIG. 24 is a graph showing a light distribution pattern formed by the vehicle lamp as shown in FIG. 17.
Figure 25:
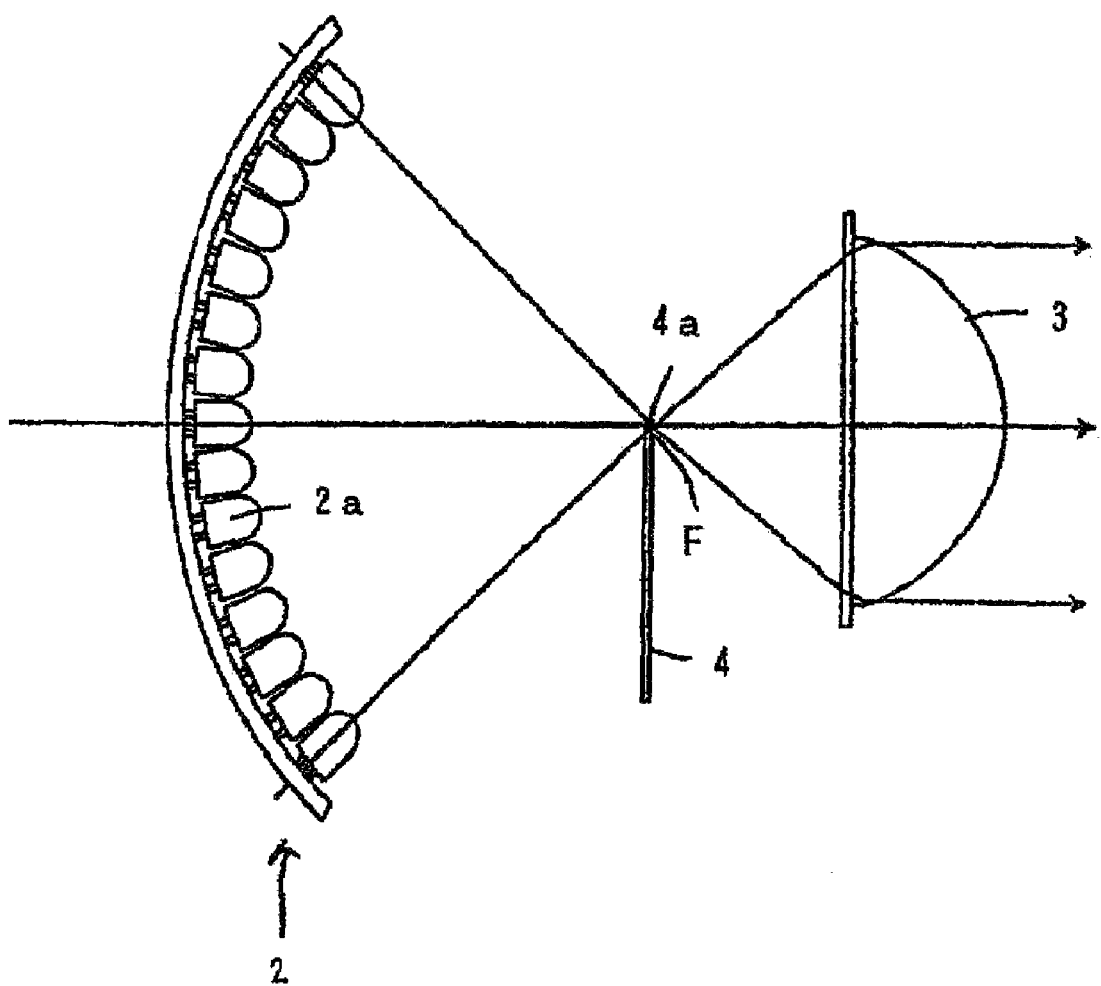
FIG. 25 is a schematic side view illustrating the composition of an example of a conventional vehicle lamp.
Figure 26:
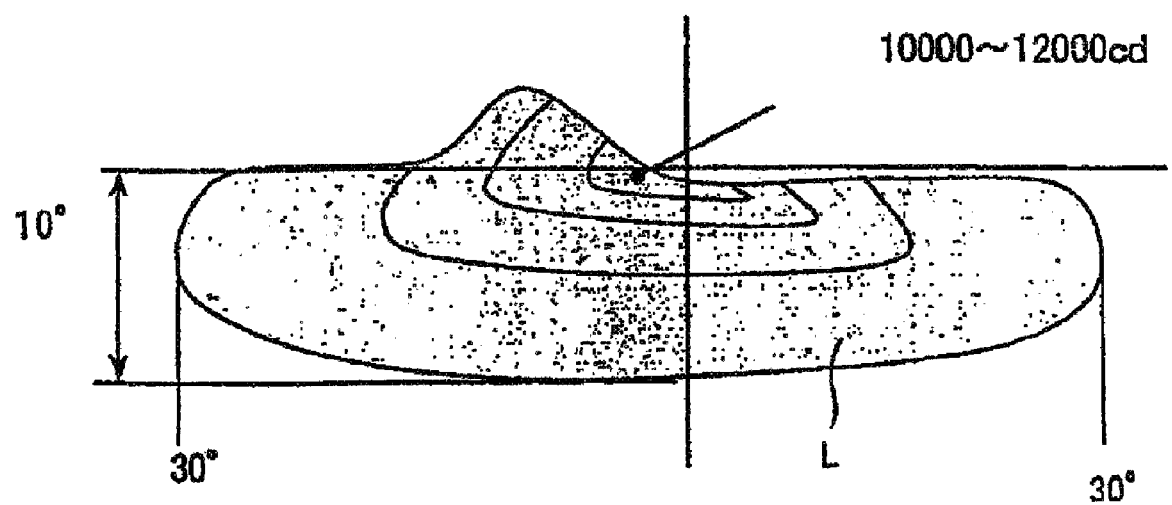
FIG. 26 is a graph schematically showing a light distribution pattern for a low beam.
Figure 27:
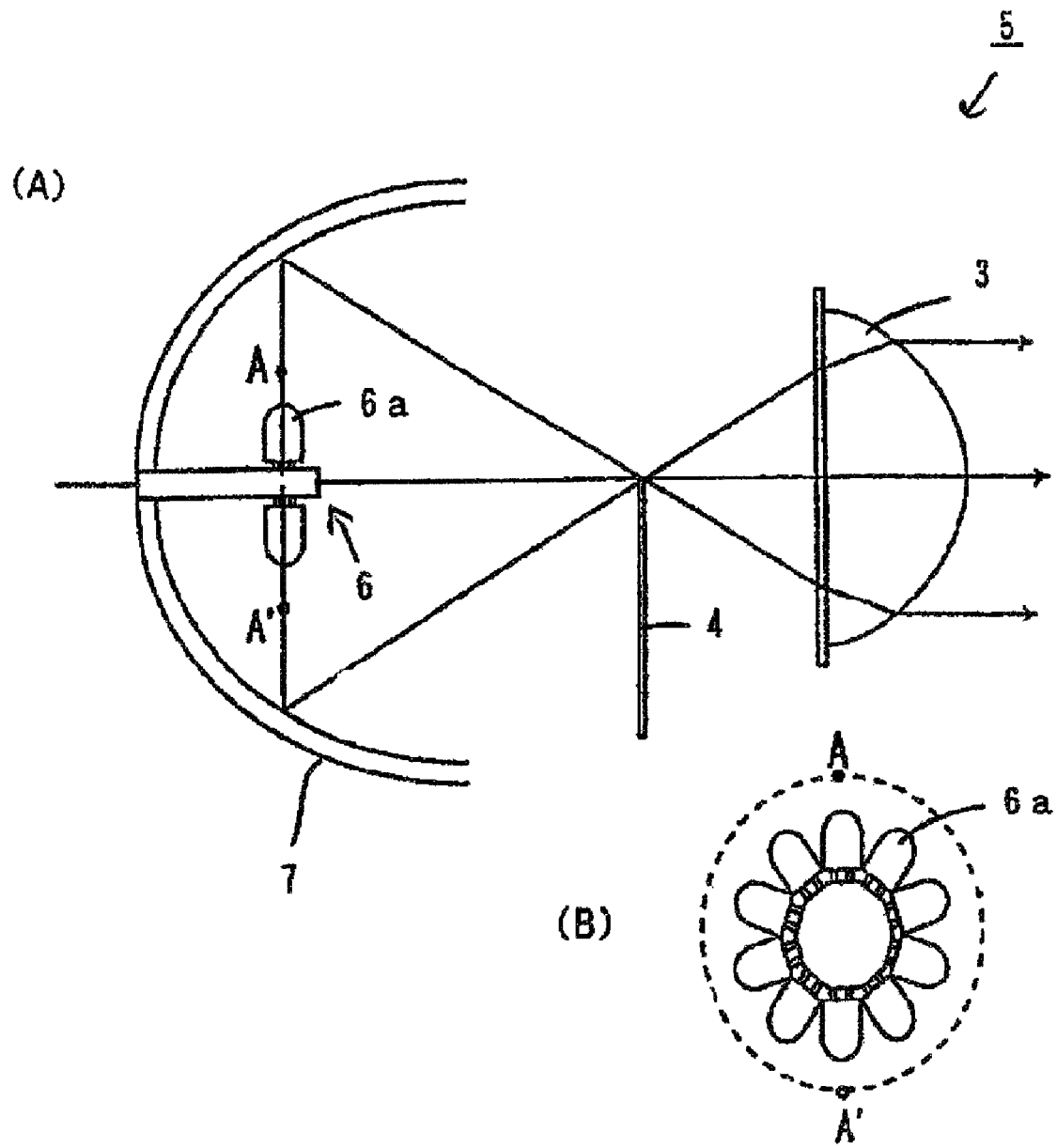
FIGS. 27 (A) and (B) are a schematic side view and partial front view, respectively, illustrating the composition of another example of a conventional vehicle lamp.
Figure 28:
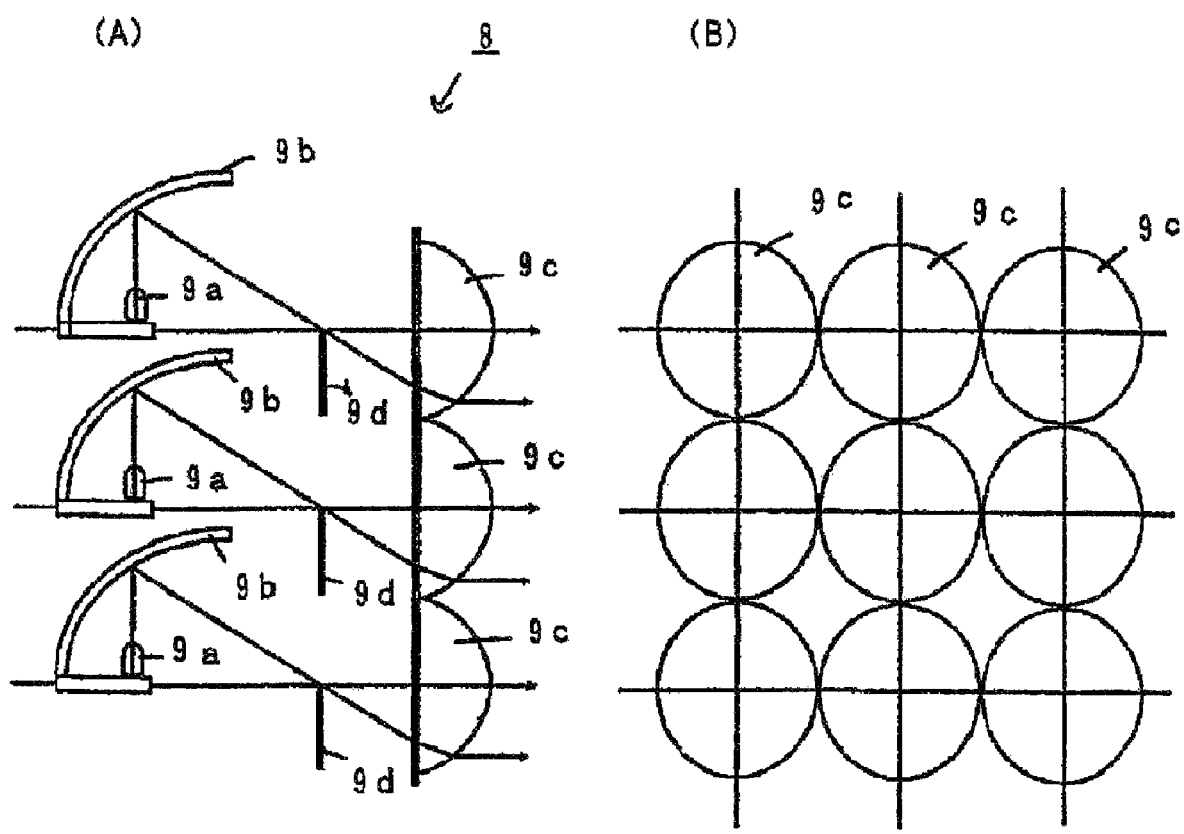
FIGS. 28 (A) and (B) are a schematic side view and front view, respectively, illustrating the composition of yet another example of a conventional vehicle lamp.

With respect to the vehicle lamp 40, as shown in FIG. 21, the set of lighting units 41 emits light to a converged area "La" and, as shown in FIG. 22, the set of lighting units 51 emits light to a diverged area "Lb," and the set of lighting units 61 emits light to an intermediate area "Lc" between the converged area and the diverged area, as shown in FIG. 23. Then, by overlapping the light distribution patterns "La", "Lb", and "Lc" formed by each set of the lighting units 41, 51 and 61, as shown in FIG. 24, a light distribution pattern L suitable for a low beam can be formed.

In the embodiments described above, the vehicle lamps 10 and 40 have lighting units 11, 21 and 31 or 41, 51 and 61, respectively, corresponding to the converged area, the diverged area and the intermediate area, respectively. However, the composition of a vehicle lamp is not limited to the above described preferred embodiments. For example, the lighting units 31 and 61 corresponding to the intermediate areas can be omitted. Furthermore, by adding a lighting unit that has a light distribution pattern for realizing a different function, for example, a daytime running lamp, a sub-lamp for a cornering lamp, a sub-headlight of a fog lamp or a so-called AFS lamp it is possible to form a multi-functional light distribution pattern with one (1) vehicle lamp. The light distribution pattern can also be divided into multiple areas and new lighting units can be added for the additional divided areas to form a multi-functional light distribution pattern with one (1) vehicle lamp. It is also possible to arbitrarily and/or optionally add or remove the lighting units by configuring the lighting units such that they are removable.

The embodiments described above disclose a light distribution characteristic for a low beam limited to the case of running the vehicle on the left side of a road. Moreover, in order to avoid the production of dazzling or blinding light directed towards oncoming cars on the right side of a car, edges of the shading boards 12e, 33c and 65 are provided. However, the invention is not limited to this light distribution characteristic for a low beam. Specifically, in the case of running the vehicle on the right side of a road, the arrangement of the edges of the shading boards can be inverted to provide the same effect as described above with respect to the vehicle driven on the left hand side of the road, i.e., diminishing the glaring, blinding or dazzling light that would be directed towards oncoming cars or pedestrians.

While illustrative and presently preferred embodiments of the present invention have been described in detail herein, it is to be understood that the inventive concepts may be incorporated in different variations and embodiments and that the appended claims are intended to be construed to include such variations except insofar as limited by the prior art.

What is claimed is:

1. A vehicle lamp comprising:
    a primary light source module having an LED as a light source and a primary light source optical axis along which the LED emits light;
    a primary optical system for distributing light from the primary light source module frontward and toward a primary predetermined area, the primary optical system having a primary optical system optical axis along which light is directed from the primary optical system, the primary optical system including,
        a primary reflector configured to direct light frontward along the primary optical system optical axis, and
        a shading member located adjacent the primary light source module, wherein
    the primary light source axis is substantially perpendicular with respect to the primary optical system optical axis; and
    a second primary light source module having a second LED as a light source and a second primary light source optical axis along which the second LED emits light, wherein the second primary light source optical axis extends in a direction substantially opposite the primary light source optical axis.

2. The vehicle lamp according to claim 1, wherein the shading member is located substantially at a focus of the primary reflector.

3. The vehicle lamp according to claim 2, wherein the shading member is an elongate substantially planar member located substantially within a plane that is substantially perpendicular to the primary optical system optical axis.

4. The vehicle lamp according to claim 2, wherein the primary shading member is an elongate substantially planar member located substantially within a plane that is substantially parallel with the primary optical system optical axis.

5. The vehicle lamp according to claim 1, wherein the primary light source module includes a shade located adjacent the LED.

6. The vehicle lamp according to claim 1, wherein the primary optical system includes a primary projector lens located adjacent the primary light source module.

7. The vehicle lamp according to claim 6, wherein the primary projector lens has a focus that is substantially at a focus of the primary reflector.

8. The vehicle lamp according to claim 1, wherein the light source module includes a housing surrounding the LED light source.

9. The vehicle lamp according to claim 8, wherein the housing surrounding the LED light source is a resin housing spaced from the LED light source.

10. A vehicle lamp comprising:
    a primary light source module having an LED as a light source and a primary light source optical axis along which the LED emits light; and
    a primary optical system for distributing light from the primary light source module frontward and toward a primary predetermined area, the primary optical system having a primary optical system optical axis along which light is directed from the primary optical system, the primary optical system including,
        a primary reflector configured to direct light frontward along the primary optical system optical axis, and
        a shading member located adjacent the primary light source module, wherein the primary light source module includes a housing surrounding the LED light source.

11. The vehicle lamp according to claim 10, wherein the housing includes a separate lens.

12. The vehicle lamp according to claim 10, wherein the shading member is an elongate substantially planar member located substantially within a plane that is substantially perpendicular to the primary optical system optical axis.

13. The vehicle lamp according to claim 10, wherein the primary shading member is an elongate substantially planar member located substantially within a plane that is substantially parallel with the primary optical system optical axis.

14. The vehicle lamp according to claim 10, wherein the primary light source module includes a shade located adjacent the LED.

15. The vehicle lamp according to claim 10, wherein the light source module includes a copper core.

16. The vehicle lamp according to claim 10, wherein the housing surrounding the LED light source is spaced from the LED light source.

17. The vehicle lamp according to claim 16, wherein the housing surrounding the LED light source is a resin housing spaced from the LED light source by a fluorescent material.

18. The vehicle lamp according to claim 10, wherein the primary optical system includes a primary projector lens located adjacent the primary light source module.

19. The vehicle lamp according to claim 18, wherein the primary projector lens includes a curved portion and an adjacent substantially linear cut off portion.

20. The vehicle lamp according to claim 19, further comprising:

a second optical system including a second projector lens, the second projector lens having a curved portion and an adjacent substantially linear cut off portion, the cut off portion of the second projector lens being located between the curved portion of the primary projector lens and the curved portion of the second projector lens.

* * * * *